United States Patent
Nomura

(10) Patent No.: US 7,282,981 B2
(45) Date of Patent: Oct. 16, 2007

(54) LEVEL CONVERSION CIRCUIT WITH IMPROVED MARGIN OF LEVEL SHIFT OPERATION AND LEVEL SHIFTING DELAYS

(75) Inventor: Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 56 days.

(21) Appl. No.: 10/533,807

(22) PCT Filed: Nov. 5, 2003

(86) PCT No.: PCT/JP03/14107

§ 371 (c)(1), (2), (4) Date: May 5, 2005

(87) PCT Pub. No.: WO2004/042923

PCT Pub. Date: May 21, 2004

(65) Prior Publication Data

US 2006/0164147 A1 Jul. 27, 2006

(30) Foreign Application Priority Data

Nov. 6, 2002 (JP) .............................. 2002-323082

(51) Int. Cl.
*H03L 5/00* (2006.01)
(52) U.S. Cl. ........................................ 327/333; 326/81
(58) Field of Classification Search ................ 327/333; 326/80, 81, 62, 63, 68
See application file for complete search history.

(56) References Cited

U.S. PATENT DOCUMENTS 3,828,202 A * 8/1974 Stopper ........................ 326/31
4,450,371 A * 5/1984 Bismarck ..................... 326/17
4,532,436 A * 7/1985 Bismarck .................... 327/208
4,695,744 A * 9/1987 Giordano .................... 327/333
5,680,064 A * 10/1997 Masaki et al. ................ 326/81
5,786,711 A * 7/1998 Choi ............................ 326/83
5,966,030 A * 10/1999 Schmitt et al. ............... 326/83
6,002,290 A    12/1999 Avery et al.
6,091,351 A    7/2000 Shimomura
6,094,083 A    7/2000 Noda
6,249,145 B1   6/2001 Tanaka et al.
6,373,315 B2 * 4/2002 Tsuji et al. ................. 327/333
6,388,602 B1 * 5/2002 Yang .......................... 341/159

(Continued)

FOREIGN PATENT DOCUMENTS

JP        S63-152220 A    6/1988

(Continued)

*Primary Examiner*—Tuan T. Lam
*Assistant Examiner*—William Hernandez
(74) *Attorney, Agent, or Firm*—Sughrue Mion, PLLC

(57) ABSTRACT

To provide a level shift circuit in which the margin of level shift operation is prevented from deteriorating when the potential difference between a first power supply and a second power supply is large. A level shift circuit for changing the signal level in a first logic circuit fed from a first power supply to the signal level in a second logic circuit fed from a second power supply, comprises: a pull-up and/or pull-down circuit fed from the second power supply for pulling up and/or pulling down the output of a level shift core circuit; and a control circuit fed from the second power supply, which receives level shift input signals and level shift output signals for controlling the pull-up and/or pull-down circuit.

13 Claims, 38 Drawing Sheets

U.S. PATENT DOCUMENTS

| | | | |
|---|---|---|---|
| 6,411,554 B1 * | 6/2002 | Kawai | 365/189.09 |
| 6,476,637 B1 * | 11/2002 | Brownlow et al. | 326/81 |
| 6,501,306 B1 * | 12/2002 | Kim et al. | 327/112 |
| 6,768,368 B2 * | 7/2004 | Kaneko et al. | 327/333 |
| 6,777,997 B2 * | 8/2004 | Tahara et al. | 327/333 |

FOREIGN PATENT DOCUMENTS

| | | |
|---|---|---|
| JP | H06-243680 A | 9/1994 |
| JP | H06-268452 A | 9/1994 |
| JP | H07-264047 A | 10/1995 |
| JP | H09-74348 A | 3/1997 |
| JP | H10-84274 A | 3/1998 |
| JP | H11-195975 A | 7/1999 |
| JP | H11-205140 A | 7/1999 |
| JP | H11-239051 A | 8/1999 |
| JP | H11-261401 A | 9/1999 |
| JP | 2000-124792 A | 4/2000 |
| JP | 2000-349618 A | 12/2000 |
| JP | 2001-68991 A | 3/2001 |

* cited by examiner

F I G. 9
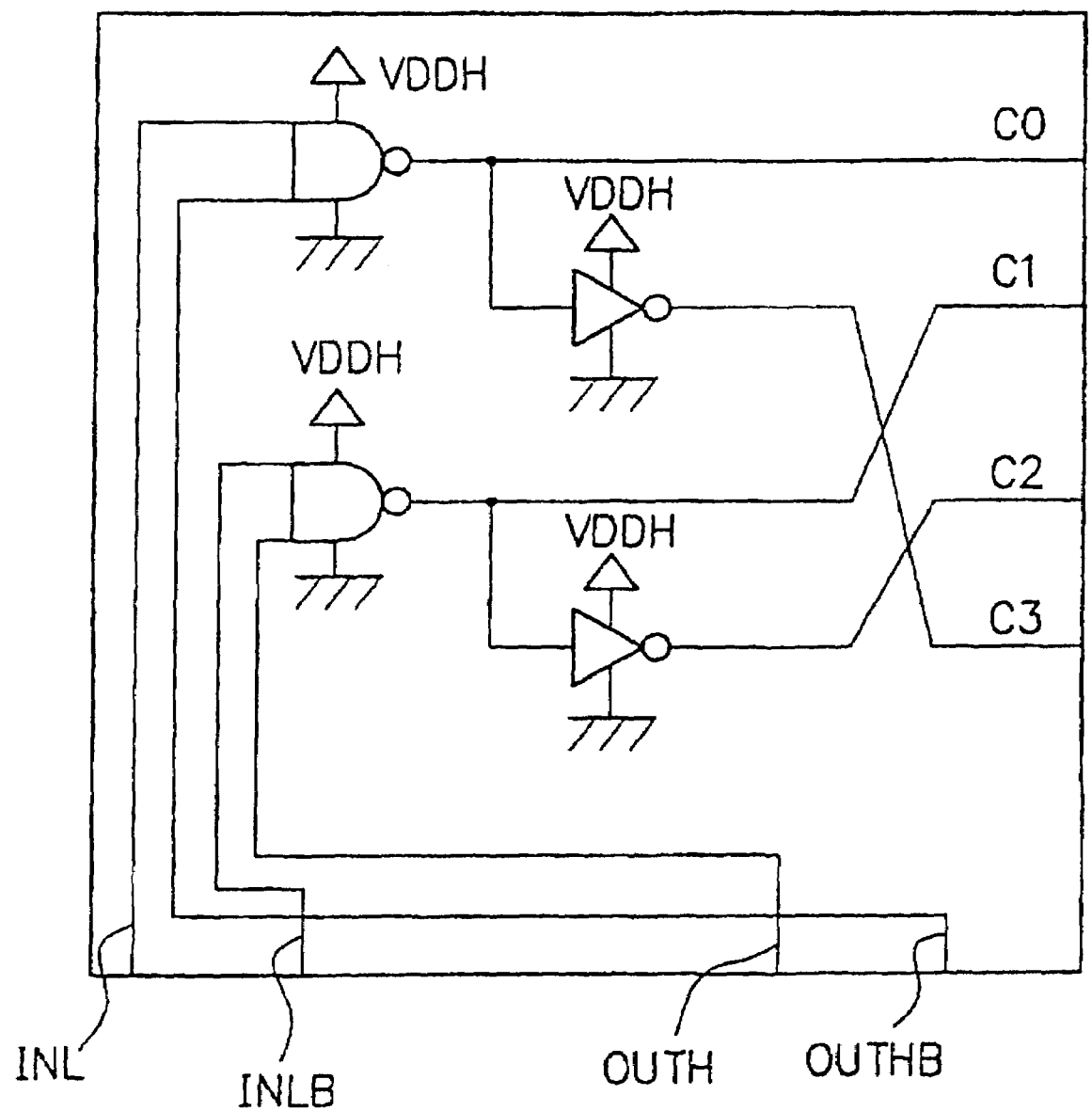

F I G. 12
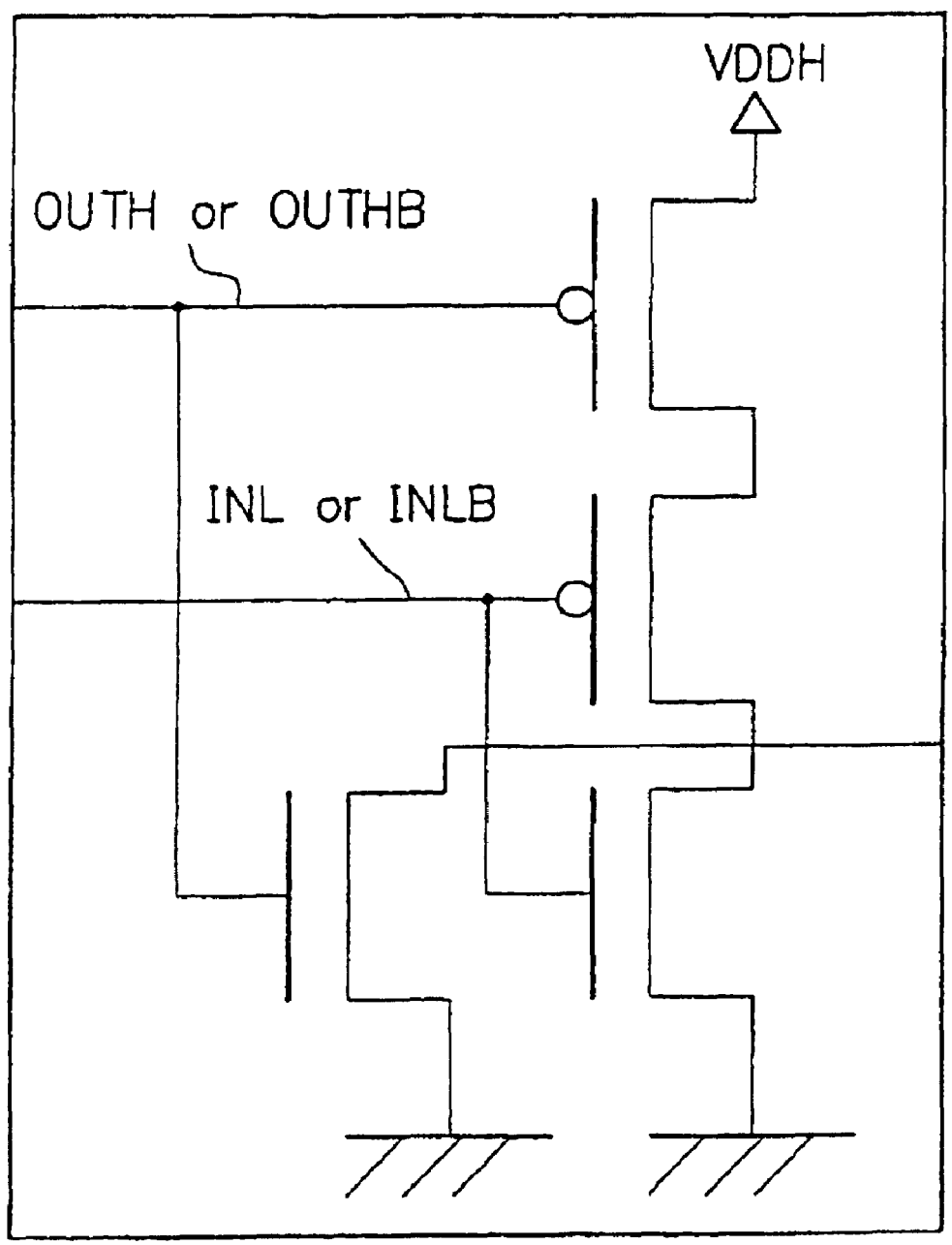

F I G. 15
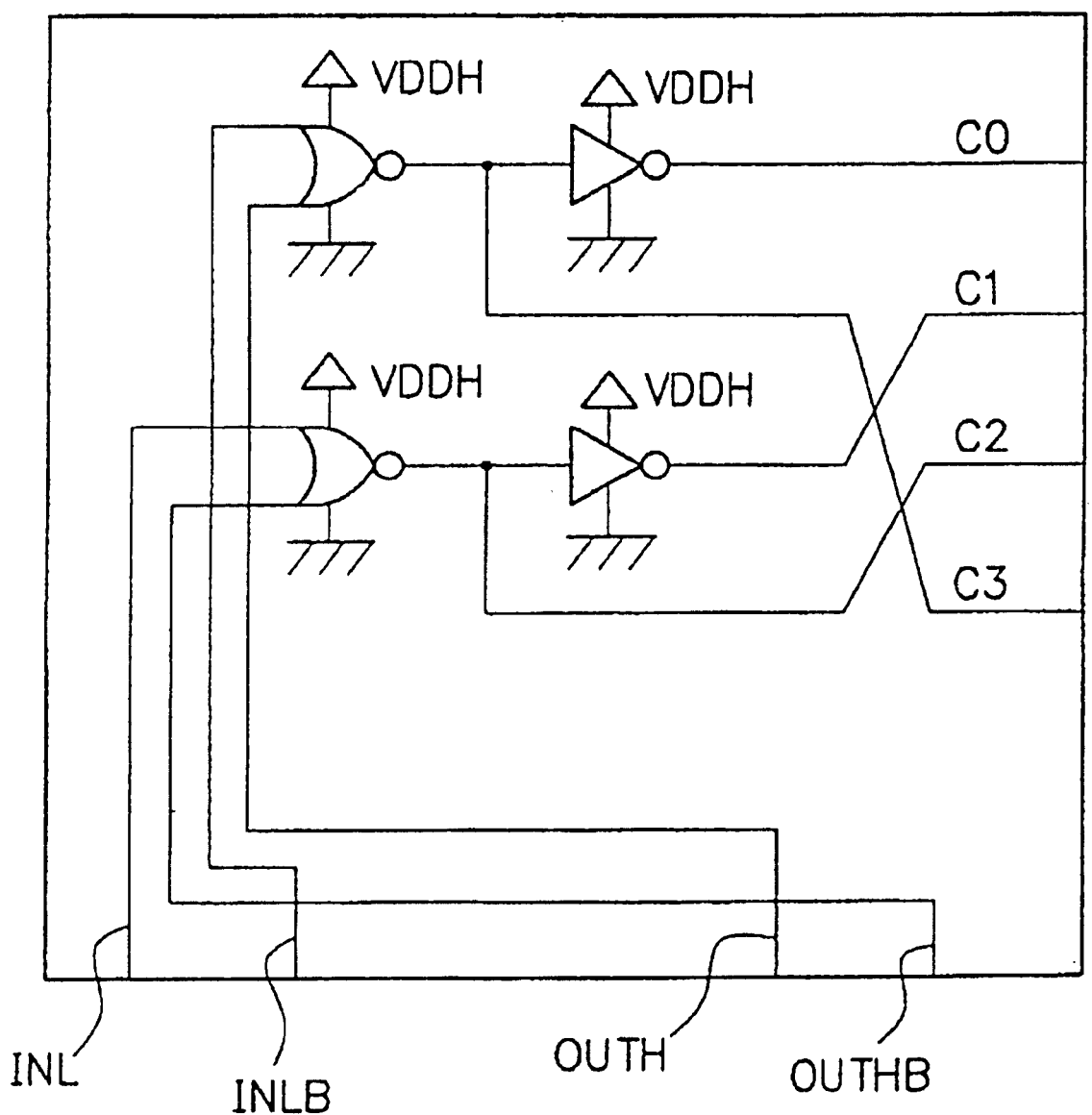

F I G. 22
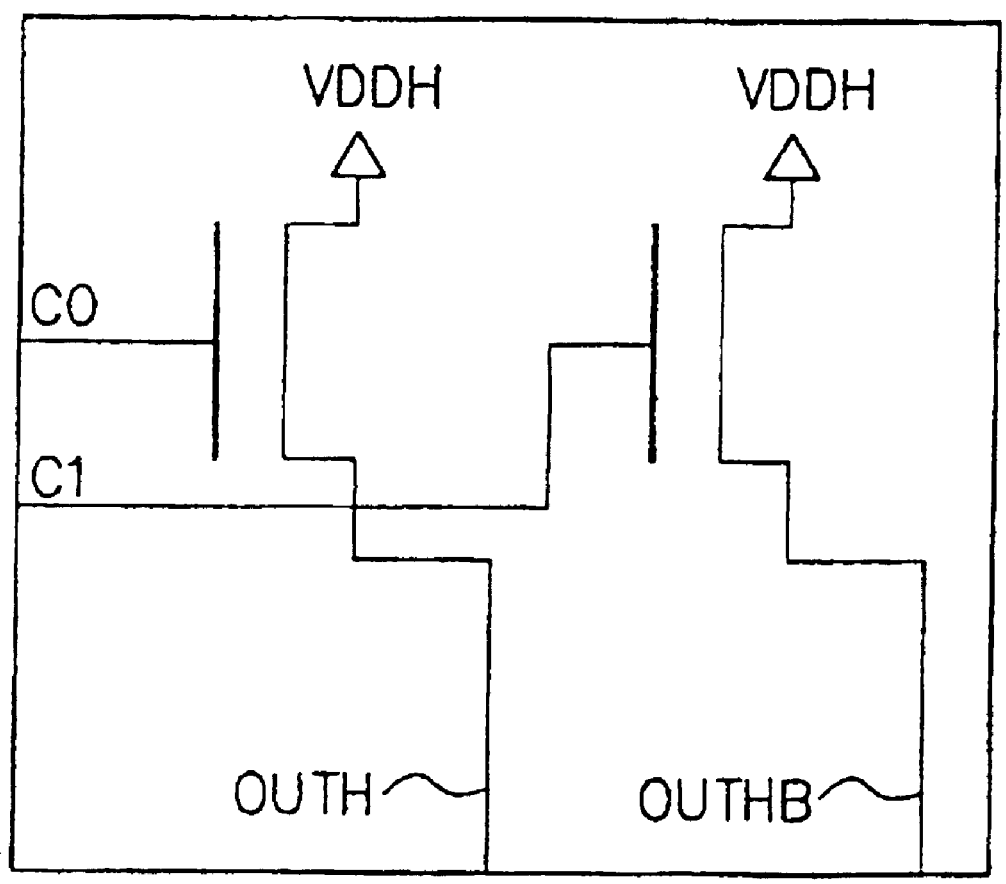

F I G. 23
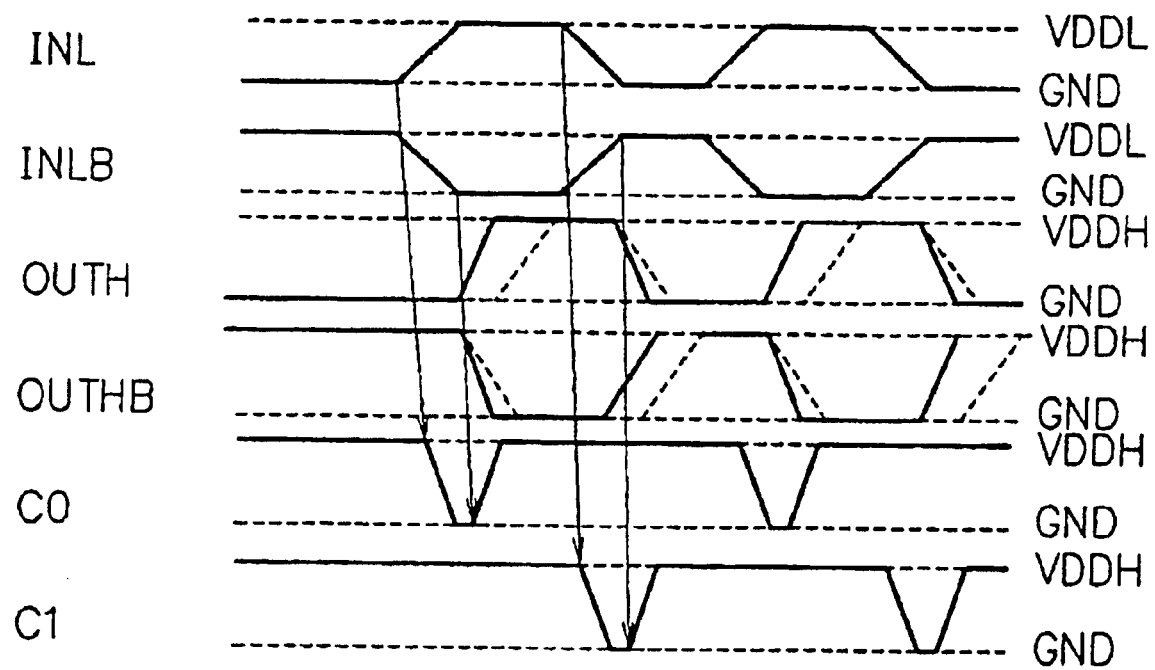

F I G. 27
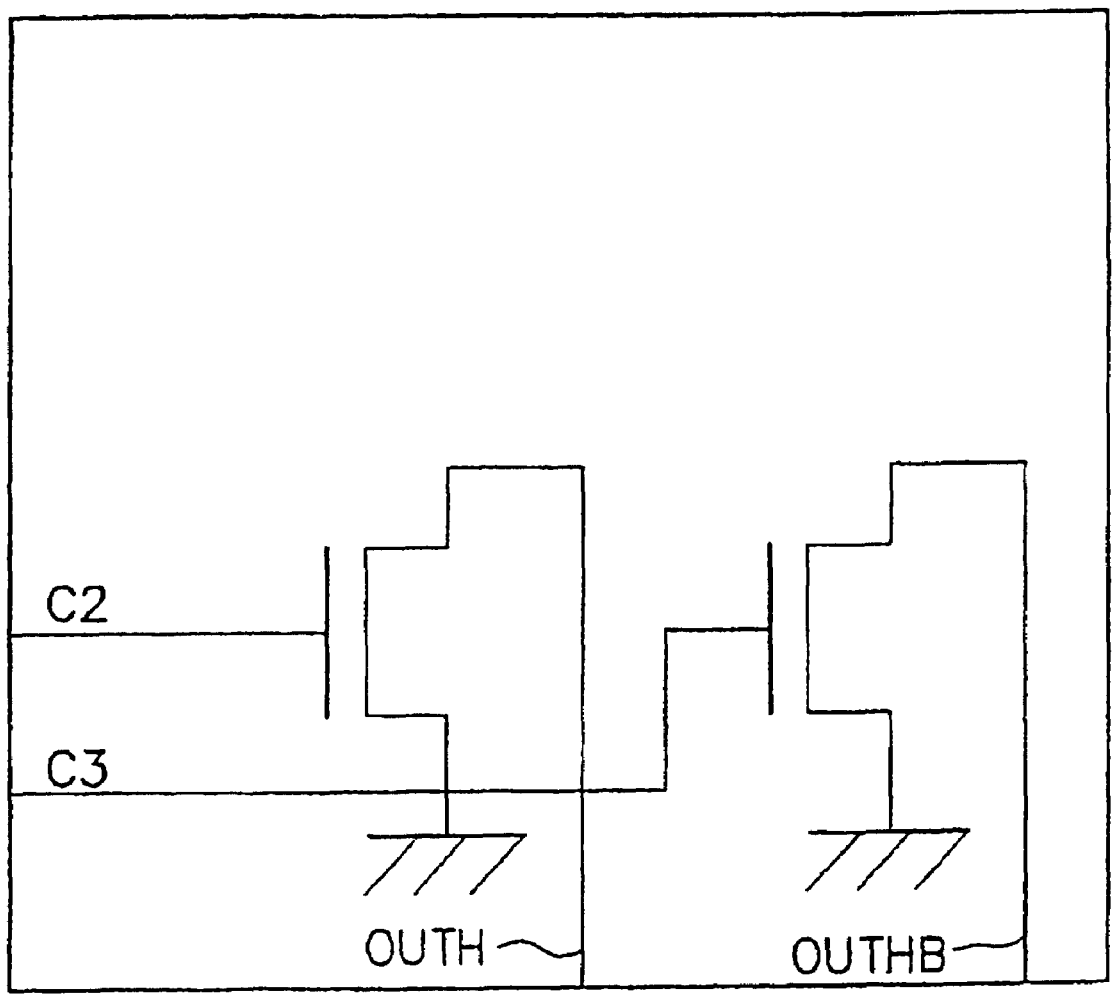

F I G. 33
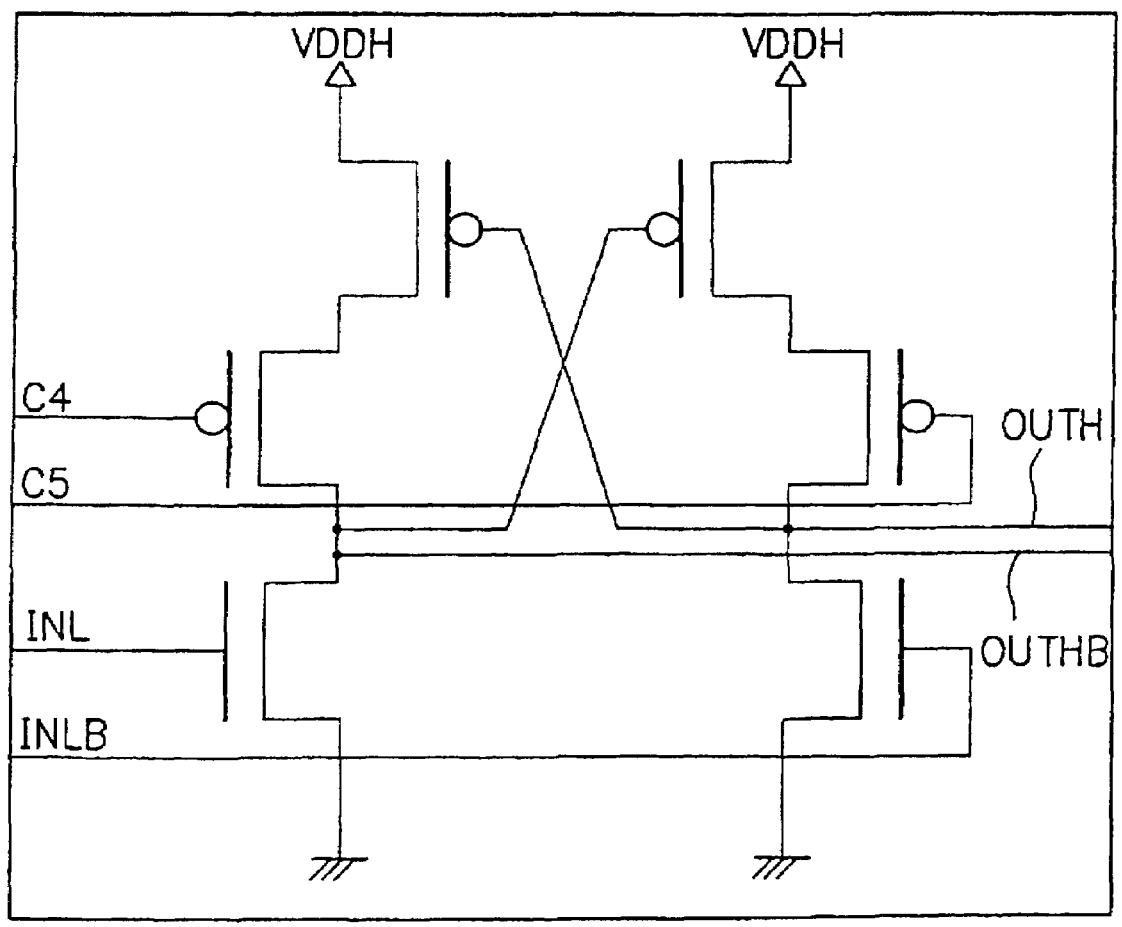

F I G. 35
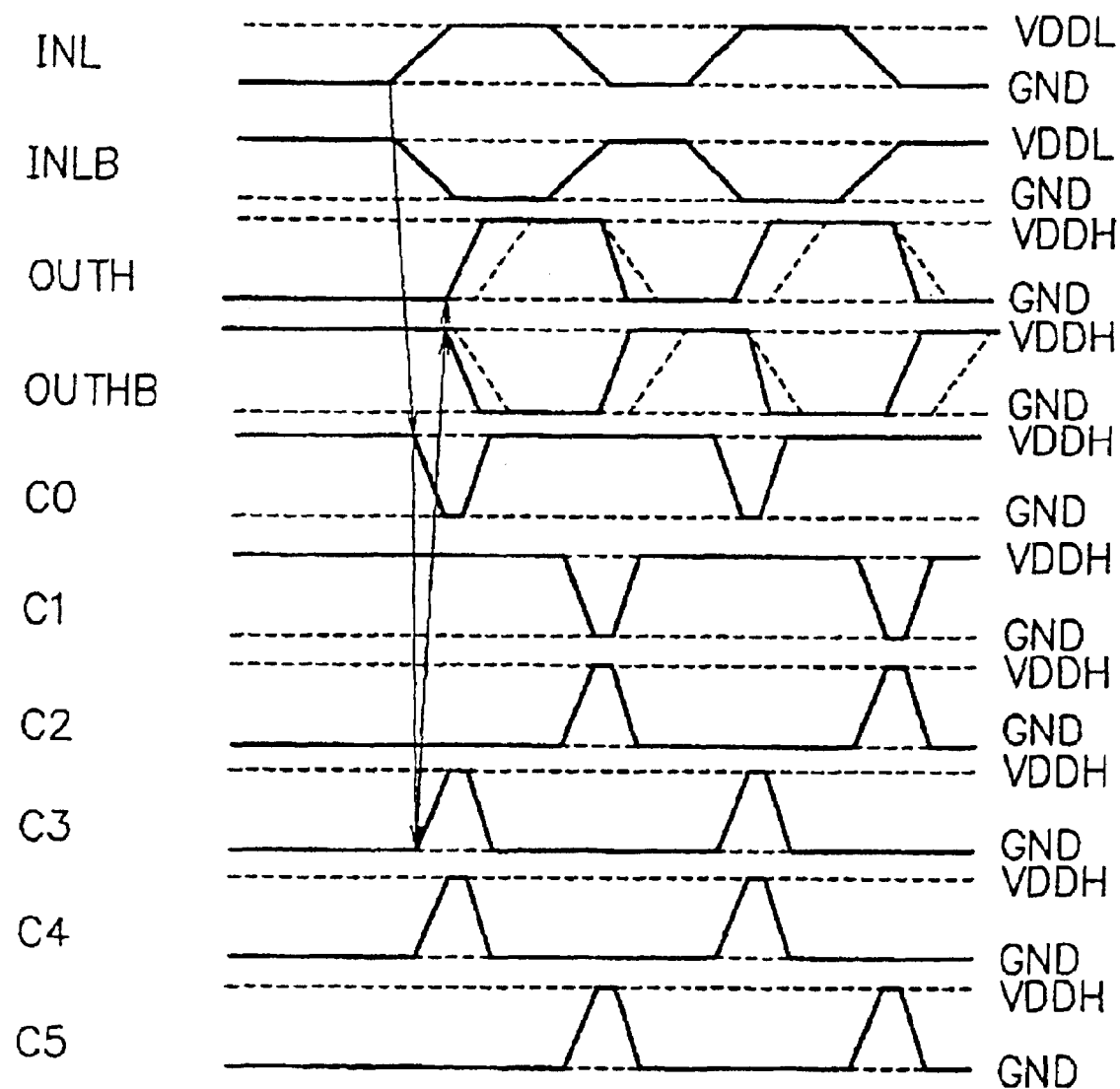

F I G. 36
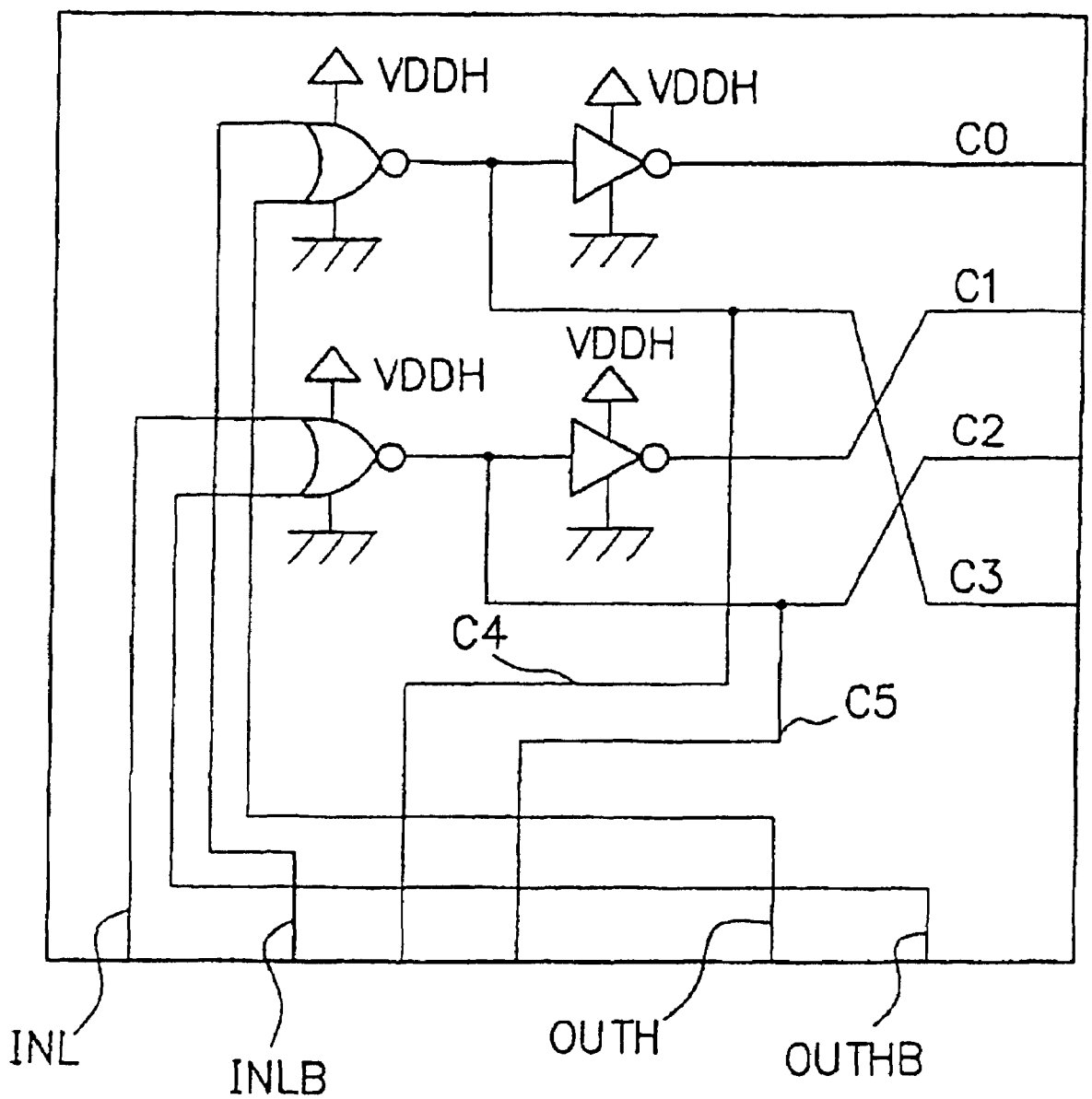

F I G. 37
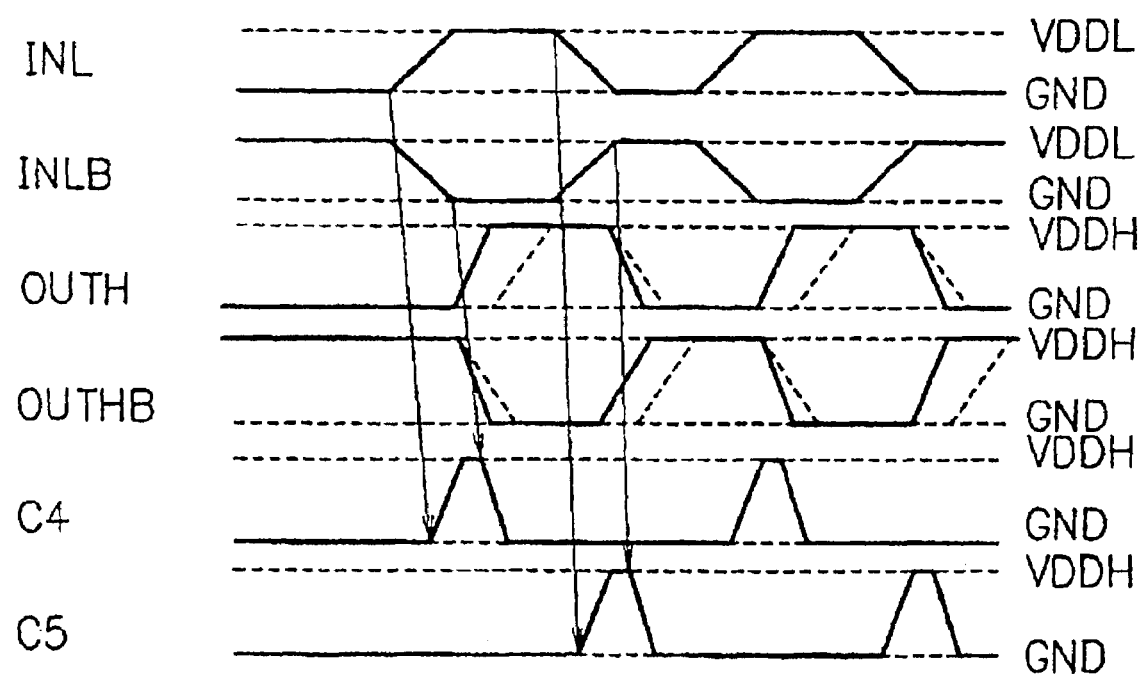

F I G. 38
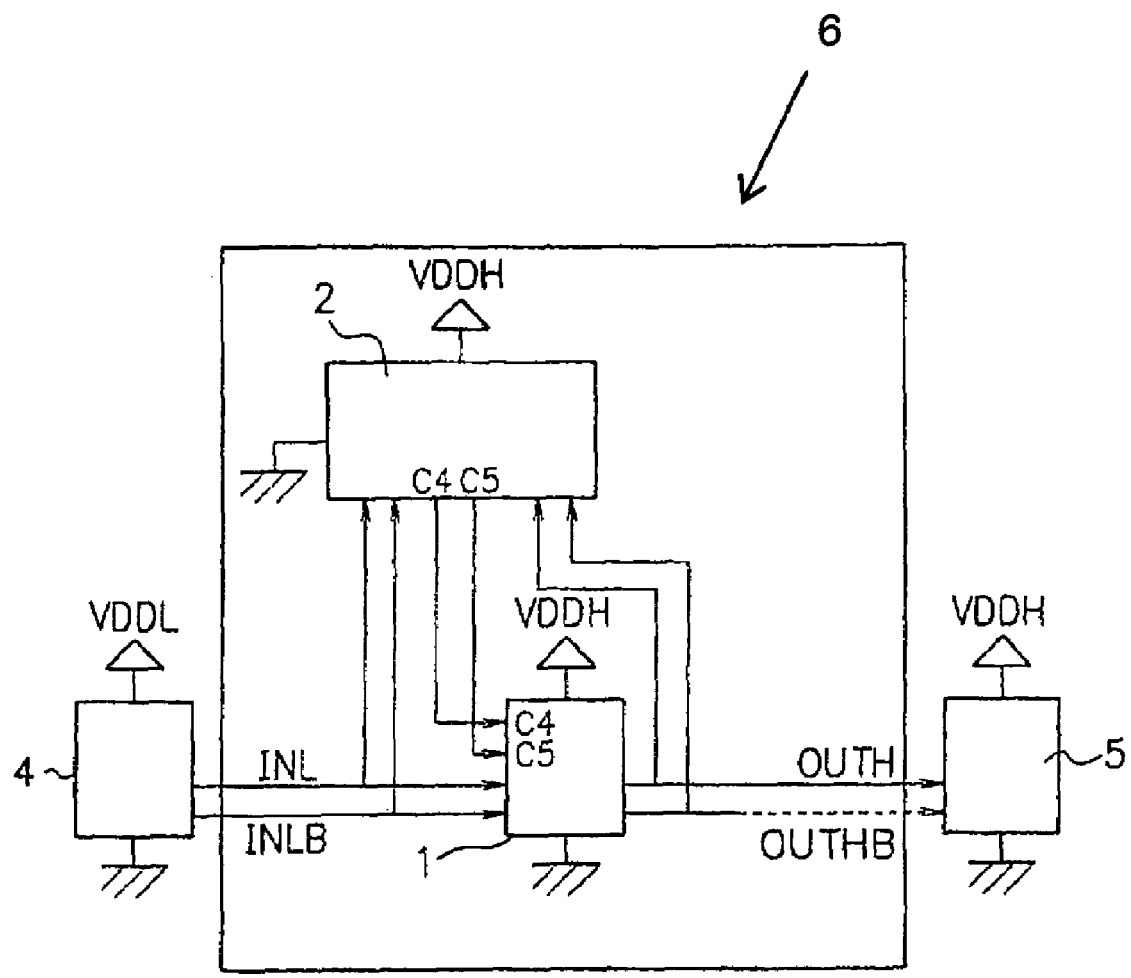

LEVEL CONVERSION CIRCUIT WITH IMPROVED MARGIN OF LEVEL SHIFT OPERATION AND LEVEL SHIFTING DELAYS

TECHNICAL FIELD

The present invention relates to a level shift circuit, and more particularly, to improvement in the margin of level shift operation and level shifting delays of a level shift circuit in which the potential difference between first and second power supplies is large.

BACKGROUND ART

In general, a level shift circuit is used in a system LSI provided with a plurality of power supplies. For example, a level shift circuit proposed in Patent Document 1, as shown in FIG. 1, has been known. Besides, the power supply voltage of a system LSI has developed a tendency to decrease in recent years.

On the other hand, in the case of a standardized IO circuit in which it is difficult to reduce the voltage, or an analog circuit in which it is difficult to lower the voltage to ensure an operation margin, the power supply voltage does not decrease. Accordingly, there is need for a level shift circuit capable of performing a stable and high-speed level shift operation even when the potential difference is large.

In order to answer the need, there has been proposed a level shift circuit as for example disclosed in Patent Document 1, which includes a pull-up circuit for supplying a first power supply voltage to a level shift output signal and is controlled based on a level shift input signal.

The inversion of a PMOS cross-coupled latch is difficult when the potential difference between first and second power supplies is large. Accordingly, as shown in FIG. 3, the level shift circuit of Patent Document 1 is provided with NMOS pull-up means, each connected to a first power supply, to facilitate the inversion.

Further, in Patent Document 2, there is disclosed a signal level shift circuit in which PMOS switches, each controlled by a level shift input signal, are arranged between a PMOS cross-coupled pair and a differential NMOS switch.

As described above, the inversion of a PMOS cross-coupled latch is difficult when the potential difference between first and second power supplies is large. Accordingly, as shown in FIG. 2, the signal level shift circuit of Patent Document 2 is provided with the PMOS switches for weakening the bond of the PMOS cross-coupled pair to facilitate the inversion.

[Patent Document 1]
  Japanese Patent Laid-Open No. SHO63-152220 (pp. 2 to 3, FIGS. 1 to 3)

[Patent Document 2]
  Japanese Patent Application laid open No. HEI6-243680 (pp. 8 to 15, FIGS. 1, 3, 5, 7 and 9)

[Patent Document 3]
  Japanese Patent Application laid open No. HEI6-268452 (pp. 4 to 5, FIGS. 1, 3 and 5)

PROBLEMS THAT THE INVENTION IS TO SOLVE

However, according to the art described in Patent Document 2, when the NMOSs of an embodiment are applied to a pull-up circuit, which is fed from the first power supply and controlled by a level shift input signal at the first power supply level, the output can be pulled up to a maximum of Vdd-Vth. In addition, as the potential difference between the first and second power supplies increases, the pull-up performance becomes poor, and enough margin of level shift operation cannot be obtained. According to the art described in Patent Document 3, PMOS switches are controlled based on a level shift input signal at the first power supply level. Consequently, as the potential difference between first and second power supplies increases, it becomes difficult to fully weaken the bond of the PMOS cross-coupled pair, and a level shift cannot be performed at a satisfactory speed.

It is therefore an object of the present invention to provide a level shift circuit capable of performing a level shift at a satisfactory speed while ensuring the margin of level shift operation when the potential difference between first and second power supplies increases.

DISCLOSURE OF THE INVENTION

In accordance with the first aspect of the present invention, there is provided a level shift circuit including a level shift core circuit which is controlled by a control circuit and/or controls a pull-up and/or pull-down circuit, wherein: the level shift core circuit, being fed from a second power supply, receives signals output from a first logic circuit and outputs signals to be input to a second logic circuit; the control circuit includes: a NOR circuit fed from the second power supply, which receives an inverted signal of the level shift input signals and a non-inverted signal of the level shift output signals; and a NOR circuit fed from the second power supply, which receives a non-inverted signal of the level shift input signals and an inverted signal of the level shift output signals; and the control circuit outputs the output signals of the two NOR circuits as control signals.

The control circuit may include: a NOR circuit fed from the second power supply, which receives an inverted signal of the level shift input signals and a non-inverted signal of the level shift output signals; a NOR circuit fed from the second power supply, which receives a non-inverted signal of the level shift input signals and an inverted signal of the level shift output signals; and a plurality of inverters fed from the second power supply, which receives the outputs of the NOR circuits, respectively. The control circuit may output the output signals of the respective NOR circuits and the inverters as control signals.

In accordance with the second aspect of the present invention, there is provided a level shift circuit comprising: a level shift core circuit for implementing a level shift; a pull-up and/or pull-down circuit fed from the second power supply for pulling up and/or pulling down level shift output signals from the level shift core circuit; and a control circuit fed from the second power supply which receives level shift input signals and the level shift output signals for controlling the pull-up and/or pull-down circuit.

The control circuit may include: a NOR circuit fed from the second power supply, which receives an inverted signal of the level shift input signals and a non-inverted signal of the level shift output signals; and a NOR circuit fed from the second power supply, which receives a non-inverted signal of the level shift input signals and an inverted signal of the level shift output signals. The control circuit may output the output signals of the two NOR circuits as control signals.

In the level shift circuit according to the second aspect, the control circuit may include: a NOR circuit fed from the second power supply, which receives an inverted signal of the level shift input signals and a non-inverted signal of the level shift output signals; a NOR circuit fed from the second power supply, which receives a non-inverted signal of the level shift input signals and an inverted signal of the level shift output signals; and a plurality of inverters fed from the second power supply, which receives the outputs of the NOR circuits, respectively. The control circuit may output the output signals of the respective NOR circuits and the inverters as control signals.

Preferably, the NOR circuit has CMOS circuitry, and each PMOS connected to the level shift input signal is a transistor which satisfies at least one of the conditions that, the channel width/channel length ratio is low or that the polarity of the threshold voltage is negative and the absolute value of the threshold voltage is large.

In accordance with the third aspect of the present invention, there is provided a level shift circuit comprising: a level shift core circuit for implementing a level shift; a pull-up and/or pull-down circuit fed from the second power supply for pulling up and/or pulling down level shift output signals from the level shift core circuit; and a control circuit fed from the second power supply which receives level shift input signals and the level shift output signals for controlling the pull-up and/or pull-down circuit.

The control circuit may include: a NAND circuit fed from the second power supply, which receives a non-inverted signal of the level shift input signals and an inverted signal of the level shift output signals; and a NAND circuit fed from the second power supply, which receives an inverted signal of the level shift input signals and a non-inverted signal of the level shift output signals. The control circuit may output the output signals of the two NAND circuits as control signals.

In the level shift circuit according to the third aspect, the control circuit may include: a NAND circuit fed from the second power supply, which receives a non-inverted signal of the level shift input signals and an inverted signal of the level shift output signals; a NAND circuit fed from the second power supply, which receives an inverted signal of the level shift input signals and a non-inverted signal of the level shift output signals; and a plurality of inverters fed from the second power supply, which receives the outputs of the NAND circuits, respectively. The control circuit may output the output signals of the respective NAND circuits and the inverters as control signals.

Preferably, the NAND circuit has CMOS circuitry, and each PMOS connected to the level shift input signal is a transistor which satisfies at least one of the conditions that the channel width/channel length ratio is low or that the polarity of the threshold voltage is negative and the absolute value of the threshold voltage is large.

Preferably, the level shift core circuit comprises a PMOS cross-coupled latch including a plurality of PMOSs and a differential NMOS switch including a plurality of NMOSs, wherein the source of each PMOS is connected to the second power supply, the gate of each PMOS is connected to the level shift output through the drain of another PMOS, the source of each NMOS of the differential NMOS switch is connected to the ground voltage GND, the drain of each NMOS is connected to the level shift output, and the gate of each NMOS is connected to the level shift input.

Preferably, the pull-up and/or pull-down circuit comprises: a plurality of PMOSs each having a source connected to the second power supply, a gate connected to the control signal from the control circuit, and a drain connected to the level shift output; and a plurality of NMOSs each having a source connected to the ground voltage GND, a gate connected to the control signal from the control circuit, and a drain connected to the level shift output.

In addition, preferably, the level shift core circuit comprises: a PMOS cross-coupled latch including a plurality of PMOSs each having a source connected to the second power supply and a gate connected to the level shift output; a plurality of PMOS switches each having a source connected to the drain of one of the PMOSs, a gate connected to the level shift input and a drain connected to the level shift output; and a differential NMOS switch including a plurality of NMOSs each having a source connected to the ground voltage GND, a drain connected to the level shift output and a gate connected to the level shift input, or the level shift core circuit comprises: a PMOS cross-coupled latch including a plurality of PMOSs each having a source connected to the second power supply and a gate connected to the level shift output through the drain of another PMOS; a differential NMOS switch including a plurality of NMOSs each having a source connected to the ground voltage GND, a drain connected to the level shift output and a gate connected to the level shift input; and NMOSs each having a drain connected to the first power supply, a gate connected to the level shift input and a source connected to the level shift output.

Further, in accordance with another aspect of the present invention, there is provided a level shift circuit for changing the signal level in a first logic circuit fed from a first power supply to the signal level in a second logic circuit fed from a second power supply, including a level shift core circuit which is controlled by a control circuit and/or controls a pull-up and/or pull-down circuit, wherein: the level shift core circuit, being fed from the second power supply, receives signals output from the first logic circuit and outputs signals to be input to the second logic circuit; the control circuit includes: a NAND circuit fed from the second power supply, which receives a non-inverted signal of the level shift input signals and an inverted signal of the level shift output signals; and a NAND circuit fed from the second power supply, which receives an inverted signal of the level shift input signals and a non-inverted signal of the level shift output signals; and the control circuit outputs the output signals of the two NAND circuits as control signals.

BRIEF DESCRIPTION OF THE DRAWINGS

FIG. 9 is a diagram showing an example of a control circuit used for a level shift circuit of the present invention.

FIG. 12 is a diagram showing an example of an OR circuit used for a level shift circuit of the present invention.

FIG. 15 is a diagram showing another example of a control circuit used for a level shift circuit of the present invention.

FIG. 22 is a circuit diagram showing another example of a pull-up circuit according to the second embodiment of the present invention.

FIG. 23 is a timing chart showing the operation of a level shifter according to the third embodiment of the present invention (when the pull-up function is performed).

FIG. 27 is a circuit diagram showing an example of a pull-down circuit according to a modified example of the second embodiment of the present invention.

FIG. 33 is a diagram showing an example of a level shift core circuit according to the forth embodiment of the present invention.

FIG. 35 is a timing chart showing the operation of a level shifter according to the fourth embodiment of the present invention.

FIG. 36 is a circuit diagram showing another example of a control circuit according to the third embodiment of the present invention.

FIG. 37 is a timing chart showing the operation of a level shifter according to the third embodiment of the present invention.

FIG. 38 is a diagram illustrating another modified example of the second embodiment of the present invention.

Figure 1:
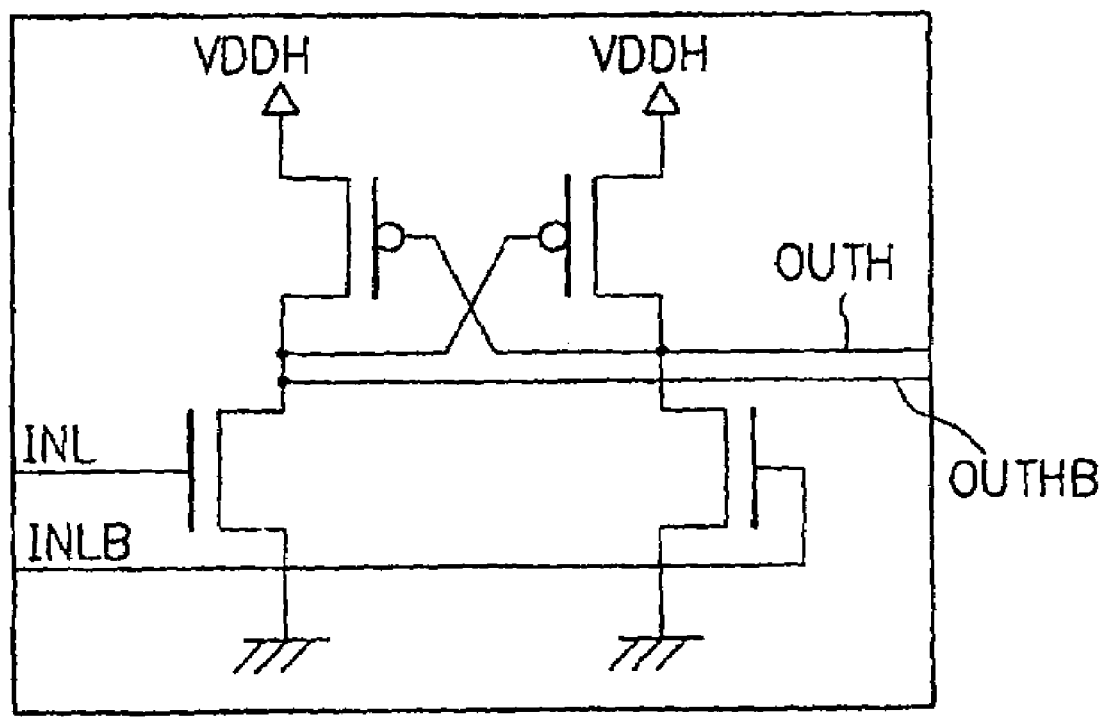
FIG. 1 is a circuit diagram showing an example of a conventional level shift circuit.
Figure 2:
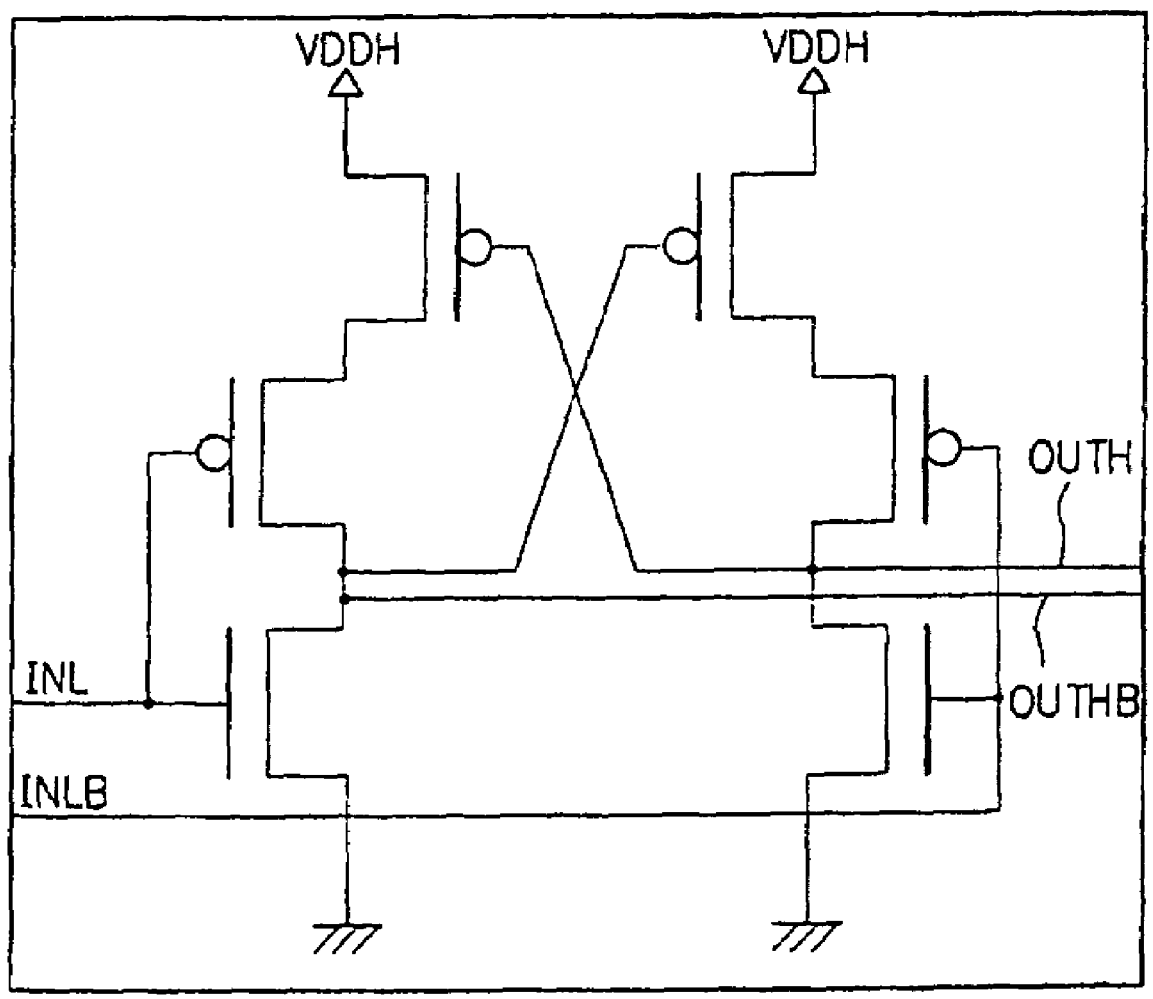
FIG. 2 is a circuit diagram showing another example of a conventional level shift circuit.
Figure 3:
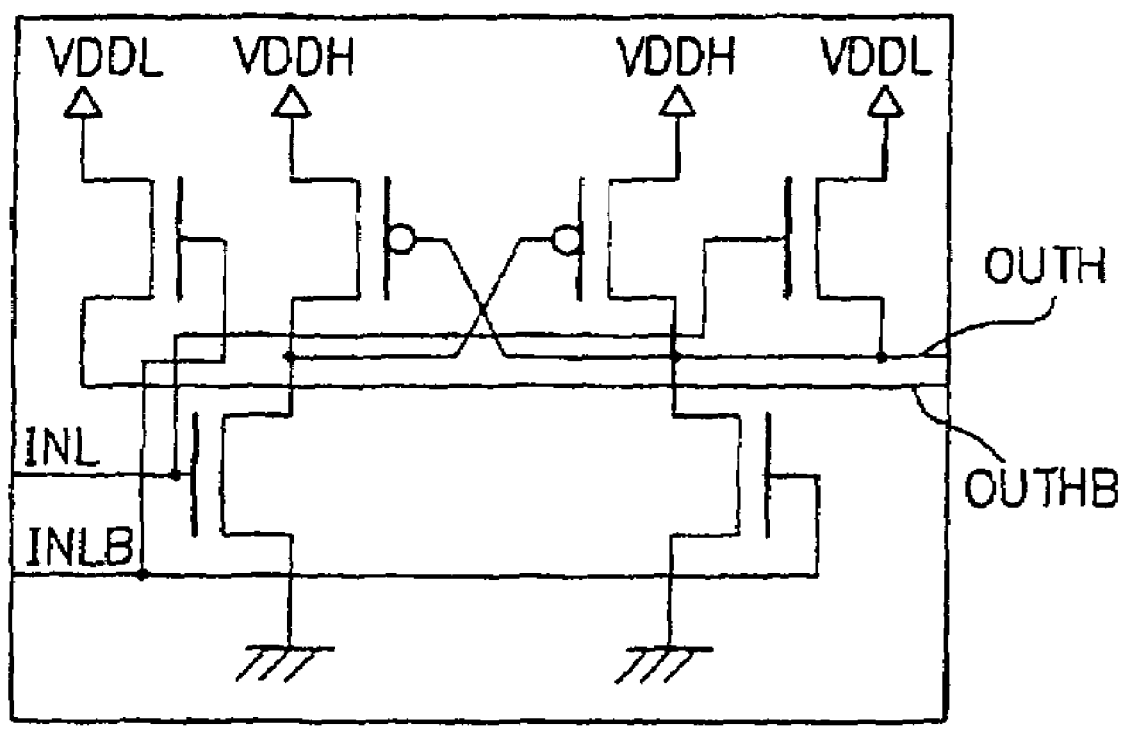
FIG. 3 is a circuit diagram showing yet another example of a conventional level shift circuit.

Incidentally, the reference numeral 1 represents a level shift core circuit; the reference numeral 2 represents a control circuit; the reference numeral 3 represents a pull-up and/or pull-down circuit; the reference numeral 3-1 represents a pull-up circuit; the reference numeral 3-2 represents a pull-down circuit; the reference numeral 4 represents a first logic circuit; and the reference numeral 5 represents a second logic circuit.

BEST MODE FOR CARRYING OUT THE INVENTION

Referring now to the drawings, a description of preferred embodiments of the present invention will be given in detail.

A level shift circuit according to an embodiment of the present invention comprises a pull-up and/or pull-down circuit fed from a second power supply for pulling up and/or pulling down level shift output, and a control circuit fed from the second power supply, which receives level shift input and output signals as well as outputting control signals to control the pull-up and/or pull-down circuit.

The pull-up and/or pull-down circuit, which is fed from the second power supply, increases the drain-source voltage of a MOS transistor for implementing the pull-up function (even when the MOS transistor is operating in the saturation region) to perform operation (function) for increasing the drive current.

Besides, with the control circuit fed from the second power supply, the gate-source voltage of a MOS transistor for implementing the pull-up and/or pull-down function is increased, and thus operation (function) for increasing the drive current is performed.

Further, with the pull-down function controlled by the control circuit fed from the second power supply, operation (function) for improving pull-down performance is performed (fulfilled).

Consequently, the pull-up performance and pull-down performance are enhanced, and the effect of supporting the inversion of a PMOS cross-coupled latch can be achieved.

Still further, a level shift circuit of the present invention is characterized in that the bond of the PMOS cross-coupled pair of a level shift core circuit is controlled based on the control signals from the control circuit fed from the second power supply. By controlling PMOS switches for adjusting the bond at the second power level, the gate-source voltage of a PMOS transistor can be reduced to 0 (zero), and thus operation (function) for sufficiently weakening the bond of the PMOS cross-coupled latch is performed.

First Embodiment

Figure 7:
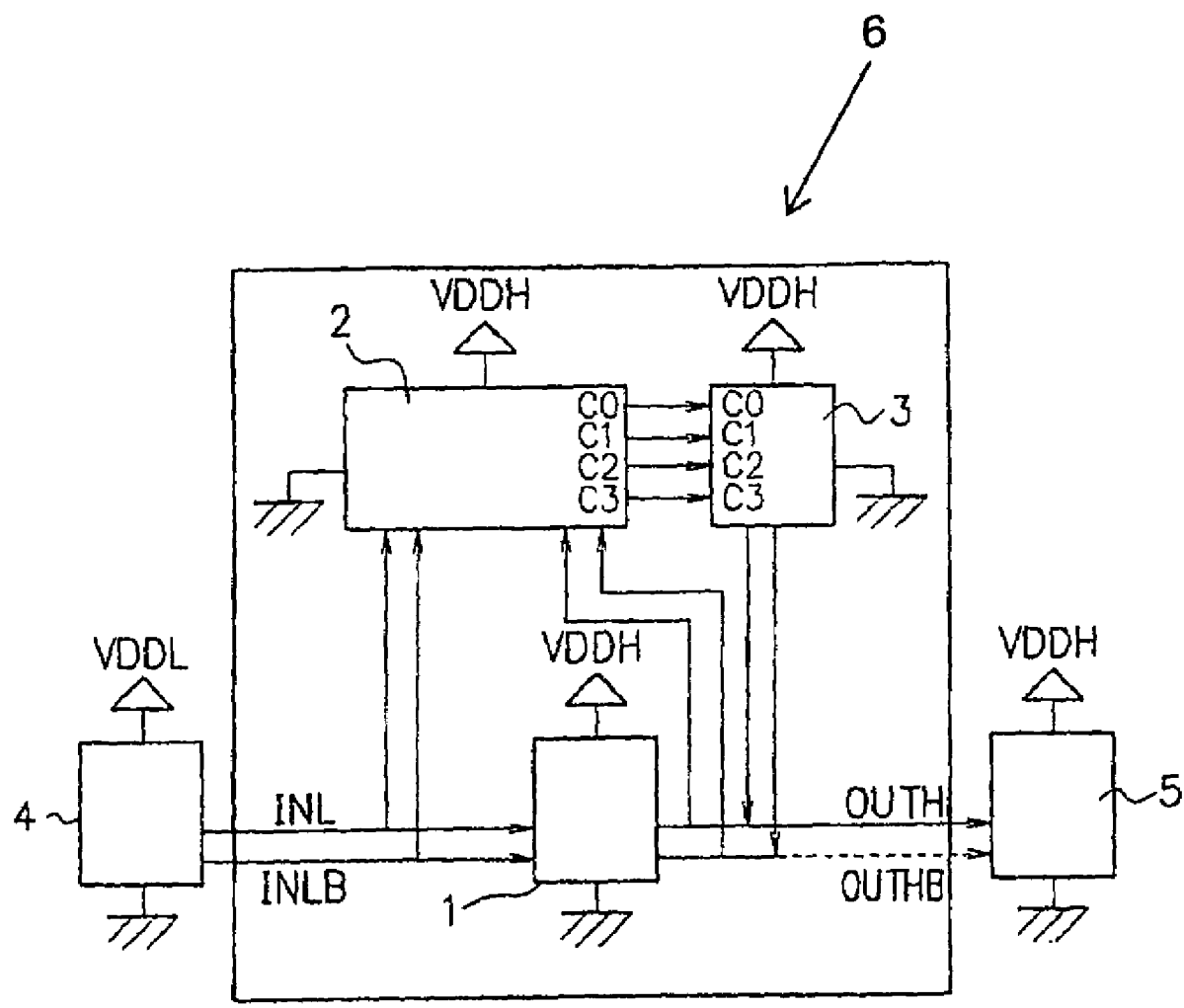
FIG. 7 is a diagram showing a level shift circuit according to an embodiment of the present invention.

FIG. 7 is a diagram showing a level shift circuit 6 according to an embodiment of the present invention. The level shift circuit 6 of the present invention changes the signal level in a first logic circuit 4 fed from a first power supply (VDDL) to the signal level in a second logic circuit 5 fed from a second power supply (VDDH), and is provided with a level shift core circuit 1. The first logic circuit 4 supplies the level shift core circuit 1 with signals INL and INLB at the first power supply level, and thereby conversion from first to second power supply level takes place.

The level shift circuit 6 of the present invention is further provided with, in addition to the level shift core circuit 1, a control circuit 2 fed from the second power supply and a pull-up and/or pull-down circuit 3 also fed from the second power supply.

The control circuit 2 receives level shift input signals (INL, INLB) as well as level shift output signals (OUTH, OUTHB), and generates control signals (C0 to C3) for controlling the pull-up and/or pull-down circuit 3. According to the control signals (C0 to C3), the pull-up and/or pull-down circuit 3 pulls up and/or pulls down the level shift output signals (OUTH, OUTHB) to perform a level shift.

The second logic circuit 5 is supplied with at least one of the level shift output signals (OUTH, OUTHB) thus obtained.

Figure 8:
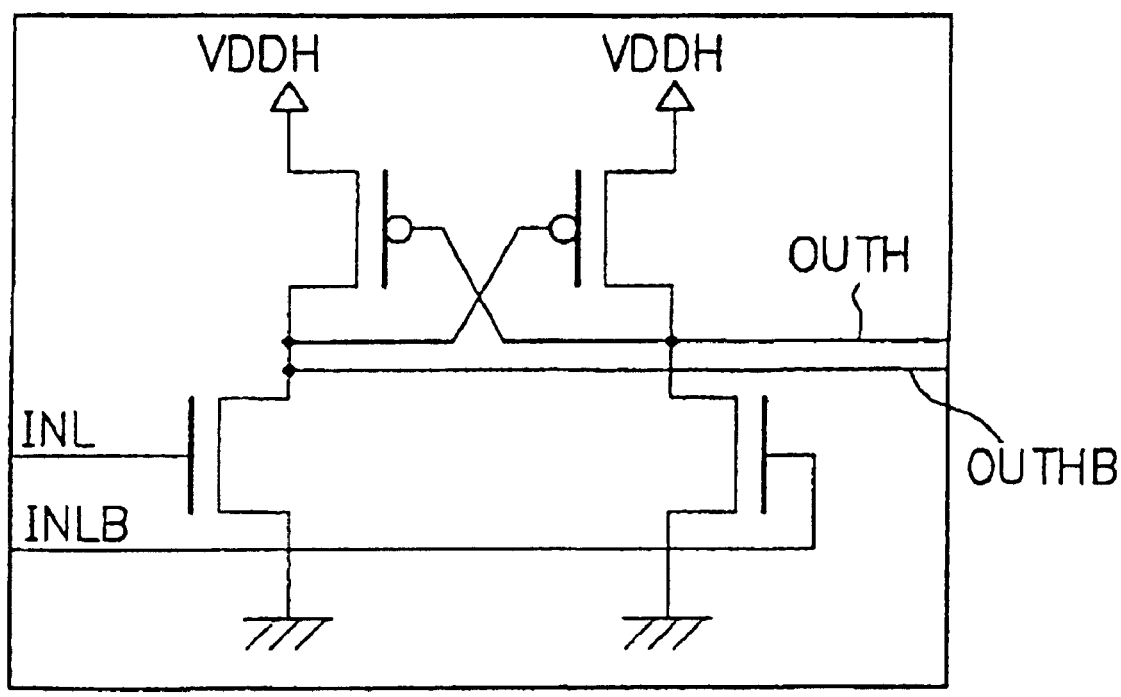
FIG. 8 is a diagram showing an example of a level shift core circuit used for a level shift circuit of the present invention.

FIG. 8 is a diagram showing an example of the level shift core circuit 1 used for the level shift circuit depicted in FIG. 7. As shown in FIG. 8, the level shift core circuit 1 according to the present invention comprises a plurality of PMOSs, in which the second power supply (VDDH) is connected to the source of each PMOS, the two types of the level shift output signals OUTHB and OUTH are connected to the drains of the PMOSs, respectively, and the drain of each PMOS is cross-coupled with the gate of another PMOS. The level shift core circuit 1 further comprises: an NMOS whose drain is connected to OUTHB, whose gate is connected to INL and whose source is connected to the ground voltage GND; and an NMOS whose drain is connected to OUTH, whose gate is connected to INLB and whose source is connected to the ground voltage GND. While FIG. 8 shows two PMOSs and two NMOSs, there may be a plurality of cross circuits each including two PMOSs. In other words, the level shift core circuit may comprise, for example, the circuits as shown in FIG. 8 in plural numbers, which are connected to one another in parallel.

FIG. 9 is a diagram showing an example of the control circuit 2 used for the level shift circuit depicted in FIG. 7.

The control circuit 2 exemplified in FIG. 9 comprises: a first NAND circuit fed from the second power supply (VDDH), which receives INL and OUTHB and outputs C0; a second NAND circuit fed from the second power supply (VDDH), which receives INLB and OUTH and outputs C1; a first inverter fed from the second power supply (VDDH), which receives the output C0 of the first NAND circuit and outputs C3; and a second inverter fed from the second power supply (VDDH), which receives the output C1 of the second NAND circuit and outputs C2.

Figure 10:
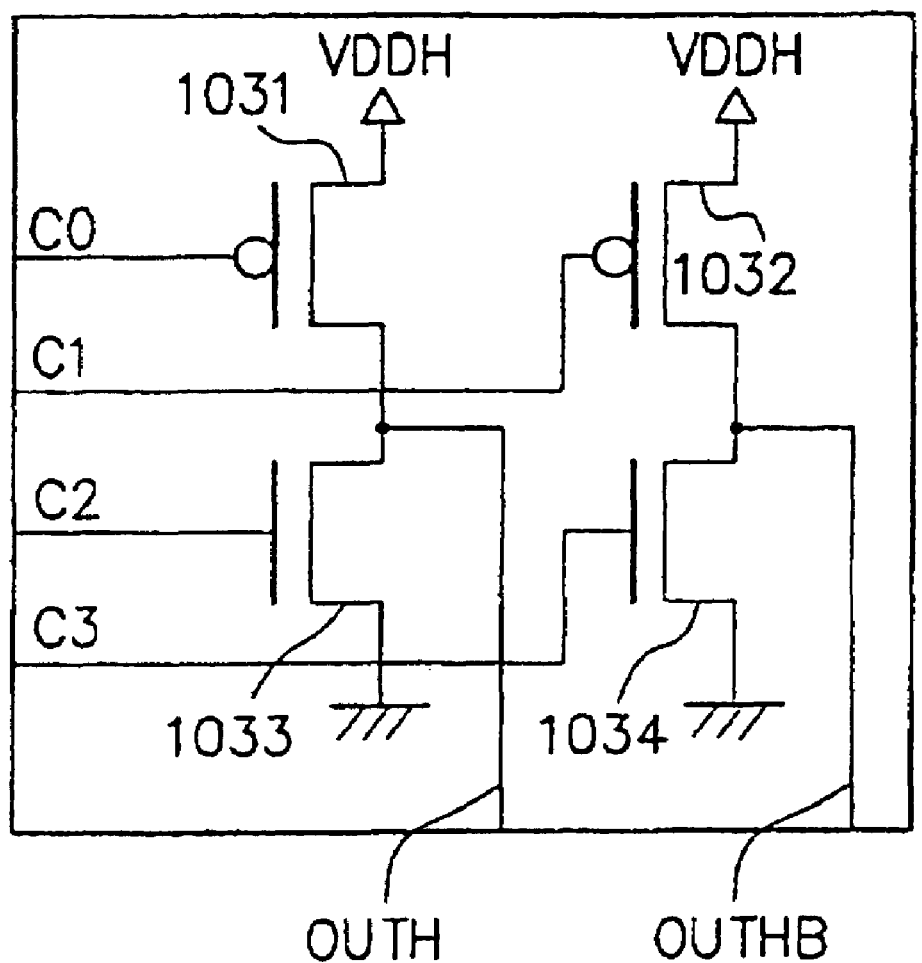
FIG. 10 is a diagram showing an example of a pull-up and/or pull-down circuit used for a level shift circuit of the present invention.

FIG. 10 is a diagram showing an example of the pull-up and/or pull-down circuit 3 used for the level shift circuit depicted in FIG. 7.

As can be seen in FIG. 10, the pull-up and/or pull-down circuit 3 used for the level shift circuit of the present invention comprises: a first PMOS 1031 whose source is connected to the second power supply (VDDH), whose gate is connected to C0, and whose drain is connected to OUTH; a second PMOS 1032 whose source is connected to the second power supply (VDDH), whose gate is connected to C1, and whose drain is connected to OUTHB; a first NMOS 1033 whose source is connected to the ground voltage GND, whose gate is connected to C2, and whose drain is connected to OUTH; and a second NMOS 1034 whose source is connected to the ground voltage GND, whose gate is connected to C3, and whose drain is connected to OUTHB.

Figure 11:
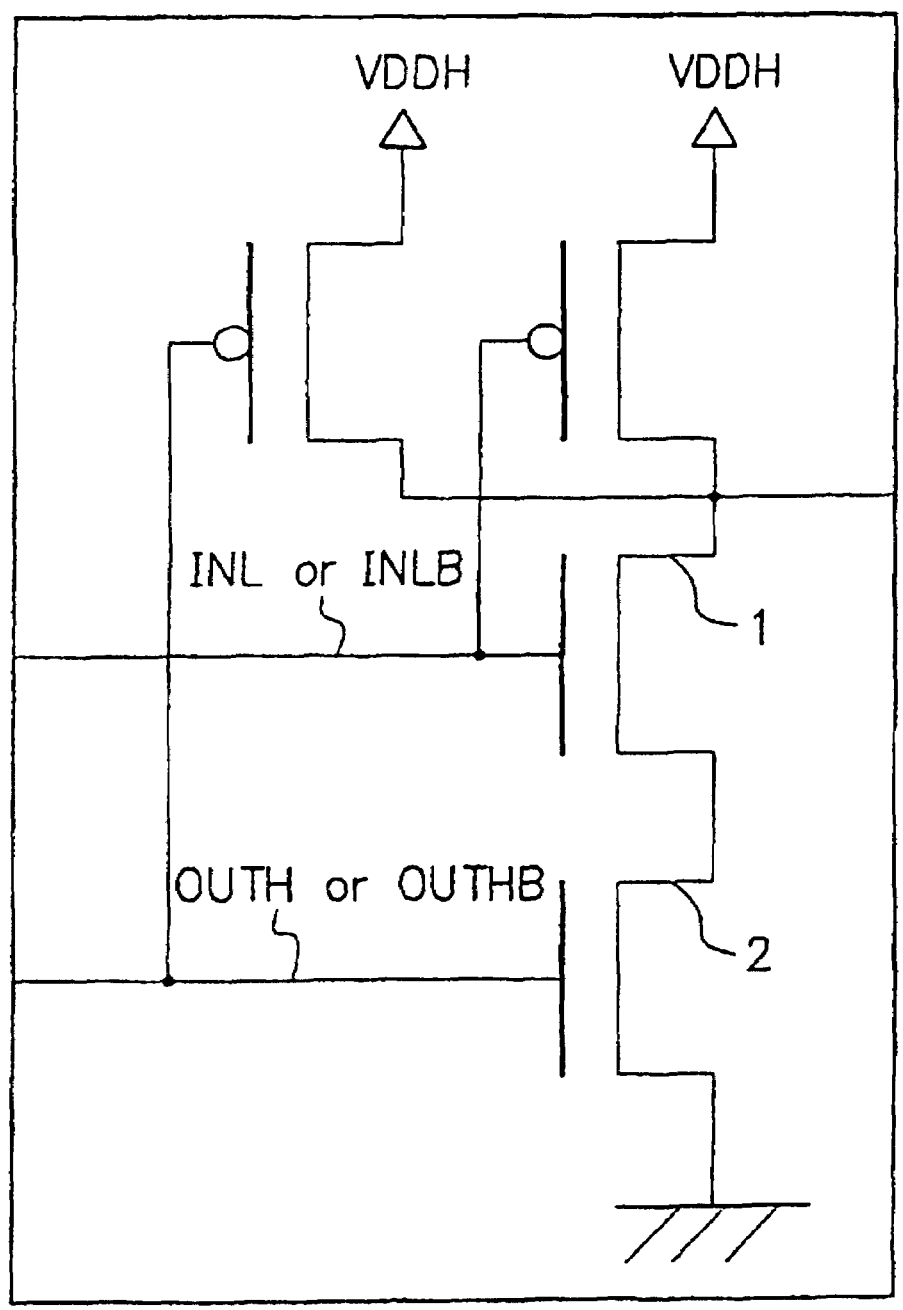
FIG. 11 is a diagram showing an example of a NAND circuit used for a level shift circuit of the present invention.

FIG. 11 is a diagram showing an example of the NAND circuit depicted in FIG. 9. Referring to FIG. 11, level shift input (INL or INLB) is connected to an NMOS 1 near the output terminal. With this construction, the gate delay can be reduced as compared to when the level shift input is connected to an NMOS 2 far from the output terminal. On the other hand, since the level shift input is at the first power supply level, in cases where the potential difference with the second power supply increases, where the threshold voltage (Vt) of the NMOS increases or, in particular, where the influence of an increase in the threshold voltage of the NMOS grows due to the substrate bias effect, the delay may develop if the level shift input (INL or INLB) is connected to the NMOS close to the output terminal. On such an occasion, the level shift input is connected to the NMOS 2 with little substrate bias effect far from the output terminal, and OUTH or OUTHB is input to the NMOS far from the output terminal. Thereby, the delay can be reduced.

Besides, in cases where the NAND operation is not performed successfully as, for example, when an NMOS is not fully turned on or a PMOS connected to the level shift input is not turned off depending on the PMOS threshold voltage because the high level of the level shift input does not reach the second power supply level, such measures as follows may be carried out either individually or in various combinations: the ratio of the channel width to the channel length (W/L) of the PMOS is reduced; the threshold voltage is increased (the absolute value of the threshold voltage is increased with the polarity thereof being negative); the W/L ratio of the NMOS is increased; or the threshold voltage is reduced. Thus, the NAND operation can be ensured.

Additionally, even when the logic operation is performed properly, if the W/L ratio of the PMOS is reduced or the threshold voltage is increased (the absolute value of the threshold voltage is increased to, for example, not more than VDDL-VDDH with the polarity thereof being negative), NAND leakage can be suppressed. In FIG. 11, "INL or INLB" indicates that INL or INLB is to be input. Similarly, "OUTH or OUTHB" indicates that OUTH or OUTHB is to be input. In this connection, INL is input in combination with OUTHB, while INLB is input in combination with OUTH. The same applies to FIG. 12.

As to the first logic circuit 4, second logic circuit 5 and inverters shown in the drawings, known ones may be employed, and also they are not directly related to the present invention. Therefore, the detailed construction and operation thereof will not be described herein.

In the following, the operation of a level shifter according to the first embodiment of the present invention will be described.

Figure 13:
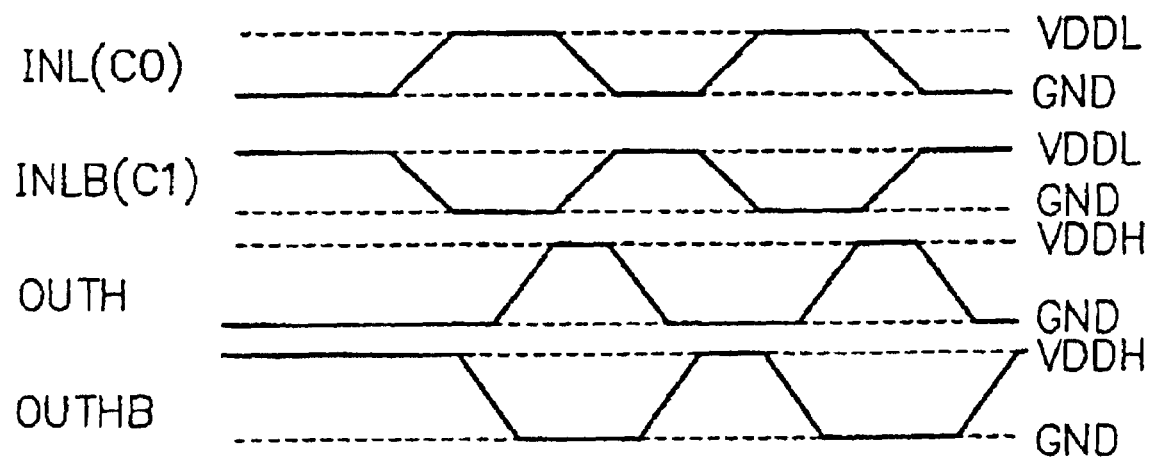
FIG. 13 is a timing chart showing an example of the operation of a level shift core circuit used for a level shift circuit of the present invention.

First, a description will be given of the operation of the level shift core circuit used for the level shifter according to the first embodiment of the present invention with reference to the timing chart of FIG. 13. Since a level shift is performed based on the differential power supply level, INL and INLB at the first power supply level are input to a differential circuit (level shift circuit), and one output (OUTH or OUTHB) connected to an NMOS provided with high level input is pulled down to a low level, while the other output is pulled up to a high level or the second power supply level.

Figure 14:
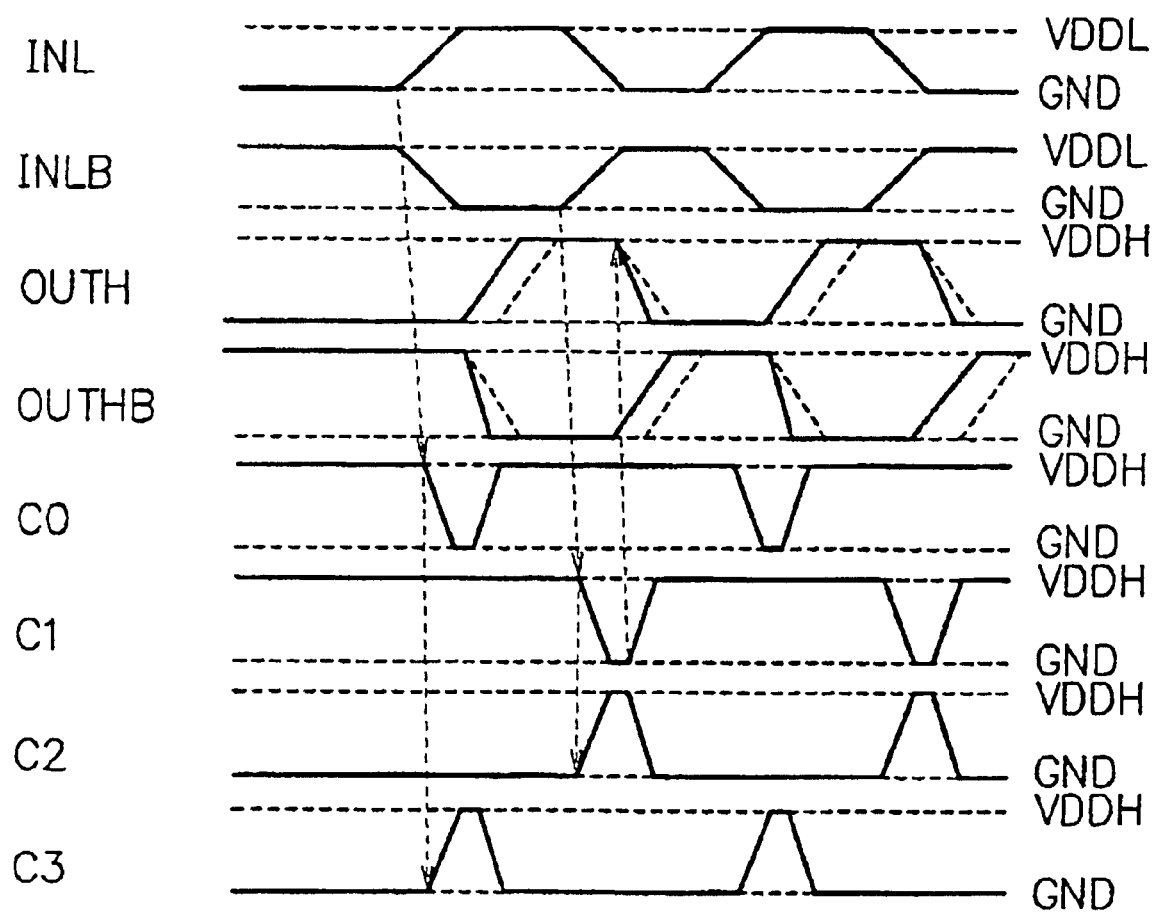
FIG. 14 is a timing chart showing an example of the operation of a control circuit and a pull-up and/or pull-down circuit used for a level shift circuit of the present invention.

Next, the operation of the level shift circuit of the present invention will be described. It is assumed that, as shown in the timing chart of FIG. 14, INL is low, INLB is high, OUTH is low, and OUTHB is high in the initial state. When INL output from the first logic circuit 4 has changed to high (INLB has changed to low), the control circuit 2, to which the signal INL has been input, outputs low C0 so that the PMOS connected to OUTH turns on in the pull-up and/or pull-down circuit 3 to pull up OUTH. In addition, the control circuit 2 outputs high C3 so that the NMOS connected to OUTHB turns on in the pull-up and/or pull-down circuit 3 to pull down OUTHB. On the other hand, when OUTHB has been reduced to low due to the operation of the level shift core circuit 1, the control circuit 2 outputs high C0. Accordingly, the PMOS of the pull-up and/or pull-down circuit 3 turns off, thereby terminating the pull-up operation. The control circuit 2 also outputs low C3, and the NMOS of the pull-up and/or pull-down circuit 3 turns off to terminate the pull-down operation. As a result, INL becomes high, INLB becomes low, OUTH becomes high, and OUTHB becomes low.

Subsequently, when INLB output from the first logic circuit 4 has changed to high (INL has changed to low), the control circuit 2, to which the signal INLB has been input, outputs low C1 so that the PMOS connected to OUTHB turns on in the pull-up and/or pull-down circuit 3 and pulls up OUTHB. In addition, the control circuit 2 outputs high C2 so that the NMOS connected to OUTH turns on in the pull-up and/or pull-down circuit 3 and pulls down OUTH. On the other hand, when OUTH has been reduced (pulled down) to low due to the operation of the level shift core circuit 1, the control circuit 2 outputs high C1. Accordingly, the PMOS of the pull-up and/or pull-down circuit 3 turns off, thereby terminating the pull-up operation. The control circuit 2 also outputs low C2, and the NMOS of the pull-up and/or pull-down circuit 3 turns off to terminate the pull-down operation. Thus, INL becomes low, INLB becomes high, OUTH becomes low, and OUTHB becomes high, resulting in the initial state.

As is described above, in response to a change of the level shift input, each level shift output is pulled-up/pulled-down as required by the control circuit 2 and the pull-up and/or pull-down circuit 3 fed from the second power supply. Consequently, the operation of the level shift core circuit 1 can be supplemented.

Therefore, in accordance with the present invention, even when the potential difference between the first and second power supplies increases, the margin of level shift operation can be ensured. Besides, as indicated with solid lines in FIG. 14, it becomes possible to suppress the increase of delays: the delay in the rising or falling edge (the delay in rise or fall timing or the start of the rising or falling edge) and the delay in the rise or fall time (a decrease in the angle of the rising or falling edge) indicated with dotted lines.

Further, in this embodiment, the control circuit 2 is provided with level shift output signals as input, which allows the pull-up and/or pull-down circuit 3 to perform the pull-up/pull-down operation in response to a change of the level shift input only if necessary. Thus, circuitry (NAND circuit) is adopted in which it is possible to reduce the PMOS off current in the control circuit provided with first power supply level input.

Furthermore, the pull-up and/or pull-down circuit 3 has a logical construction to be turned off on completion of the supplemental operation, and does not prevent or unnecessarily delay the operation of the level shift circuit. Thereby, the level shift circuit of the present invention is capable of high-speed operation.

Modified Example 1 of the First Embodiment

In the above embodiment, as the circuitry in which the PMOS off current is reduced, NOR circuitry as shown in FIG. 15 may be employed instead of the NAND circuitry as shown in FIG. 9. However, in order to prevent the PMOS off current in a NOR circuit, it is required to increase the threshold voltage of PMOSs each connecting to the level shift input (to not more than VDDL-VDDH=R). In this case, preferably, the NOR circuit is connected to an PMOS near the output terminal as shown in FIG. 12 to reduce the gate delay and make use of the substrate bias effect. Incidentally, aforementioned "R", VDDL-VDDH, is a negative value. The threshold voltage Vt increases as the absolute value of "R" becomes larger.

Modified Example 2 of the First Embodiment

Figure 16:
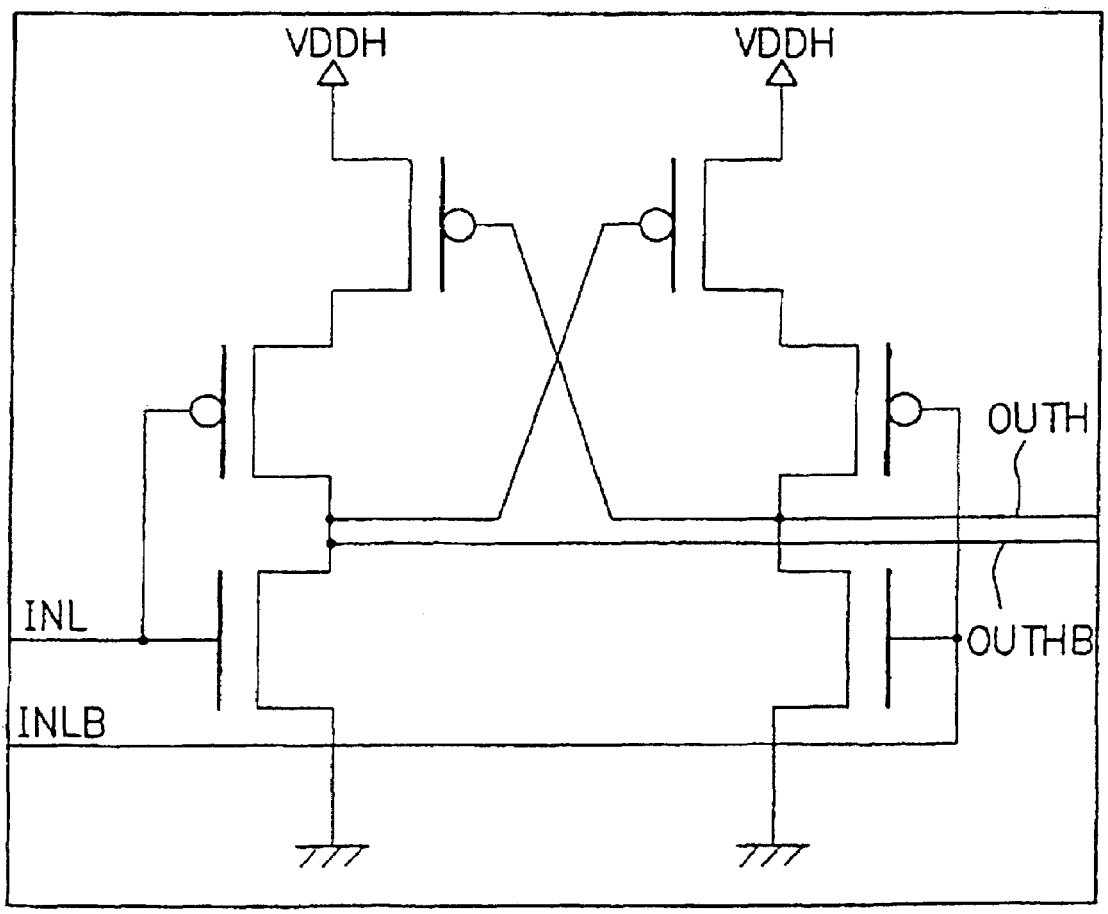
FIG. 16 is a diagram showing another example of a level shift core circuit used for a level shifter of the present invention.

In the level shift circuit according to the first embodiment of the present invention, the level shift core circuit 1 may be implemented with different circuitry than that described previously for the first embodiment in connection with FIG. 8. For example, as shown in FIG. 16, a PMOS switch may be provided to the respective drain sides of the PMOS cross-coupled pair. The level shift circuit operates in the same manner as in the first embodiment set forth hereinbefore, and the description will not be repeated here. According to the modified example of the first embodiment, with the level shift core circuit 1 of FIG. 16, the bond of the PMOS cross-coupled pair can be further weakened when the first power supply voltage (VDDL) falls as compared with the level shift core circuit of FIG. 8. More specifically, as can be seen in FIG. 16, the level shift core circuit comprises a PMOS cross-coupled pair (a pair of PMOSs), a pair of PMOS switches (another pair of PMOSs), and a pair of NMOSs. The second power supply (VDDH) is connected to the source of each PMOS of the cross-coupled pair (a pair of PMOSs). The two types of the level shift output signals OUTHB and OUTH are connected to the gates of the PMOS cross-coupled pair, respectively, and the drains of the PMOS switches, respectively. The source of each PMOS switch is connected to the drain of one of the PMOSs. The NMOSs includes: an NMOS whose drain is connected to OUTHB, whose gate is connected to INL and whose source is connected to the ground voltage GND; and an NMOS whose drain is connected to OUTH, whose gate is connected to INLB and whose source is connected to the ground voltage GND. As just described, a couple of the PMOS switches composed of PMOSs are provided between the PMOS cross-coupled pair and the NMOSs. Thus, the strength of the cross bond between the PMOSs forming the PMOS cross-couple can be reduced, and transition between high and low can be accelerated.

In the case of adopting the level shift core circuit 1 shown in FIG. 16, as the applicable control circuit 2 may be cited the one having NAND circuits as described previously in connection with FIG. 9 (preferably, such circuit as shown in FIG. 11 is selected as the NAND circuit), or the one having the NOR circuitry shown in FIG. 15 as in the modified example 1 of the first embodiment (preferably, the NOR circuit as shown in FIG. 12 is selected).

Modified Example 3 of the First Embodiment

Figure 17:
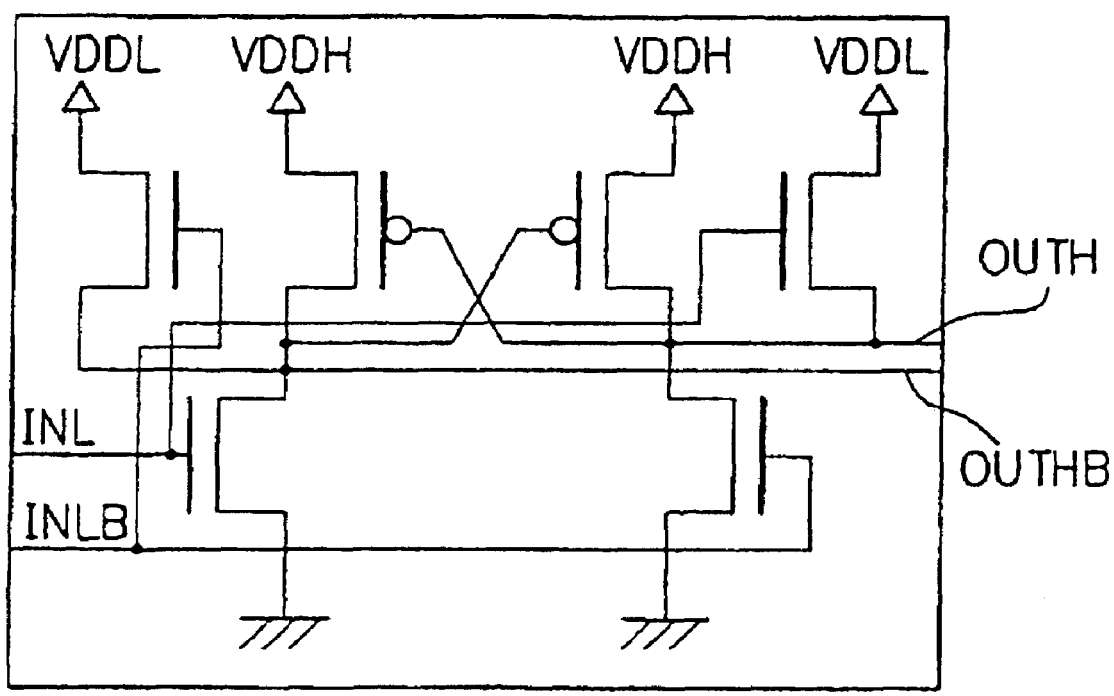
FIG. 17 is a diagram showing yet another example of a level shift core circuit used for a level shifter of the present invention.

As a substitute for the level shift core circuit 1 of FIG. 8 or 16, a circuit as shown in FIG. 17 may be employed. The level shift core circuit 1 includes two pull-up NMOSs each having a source connected to the level shift output, a gate connected to the level shift input, and a drain connected to the first power supply (VDDL), thus supporting the transition of the outputs to high. Thereby, a level shift can be performed at a higher speed. In addition, the margin of level shift operation can be ensured when the potential difference between the first and second power supplies increases.

The level shift circuit also operates in the same manner as in the first embodiment set forth hereinbefore, and the description will not be repeated here. Incidentally, the level shift core circuit 1 of modified example 3 may be used in different combinations with the control circuit 2 as in the case of modified example 2. As examples of the control circuit 2 may be cited the one having NAND circuits as described previously in connection with FIG. 9 (preferably, such circuit as shown in FIG. 11 is selected as the NAND circuit), or the one having the NOR circuitry shown in FIG. 15 (preferably, the NOR circuit as shown in FIG. 12 is selected).

Second Embodiment

Figure 6:
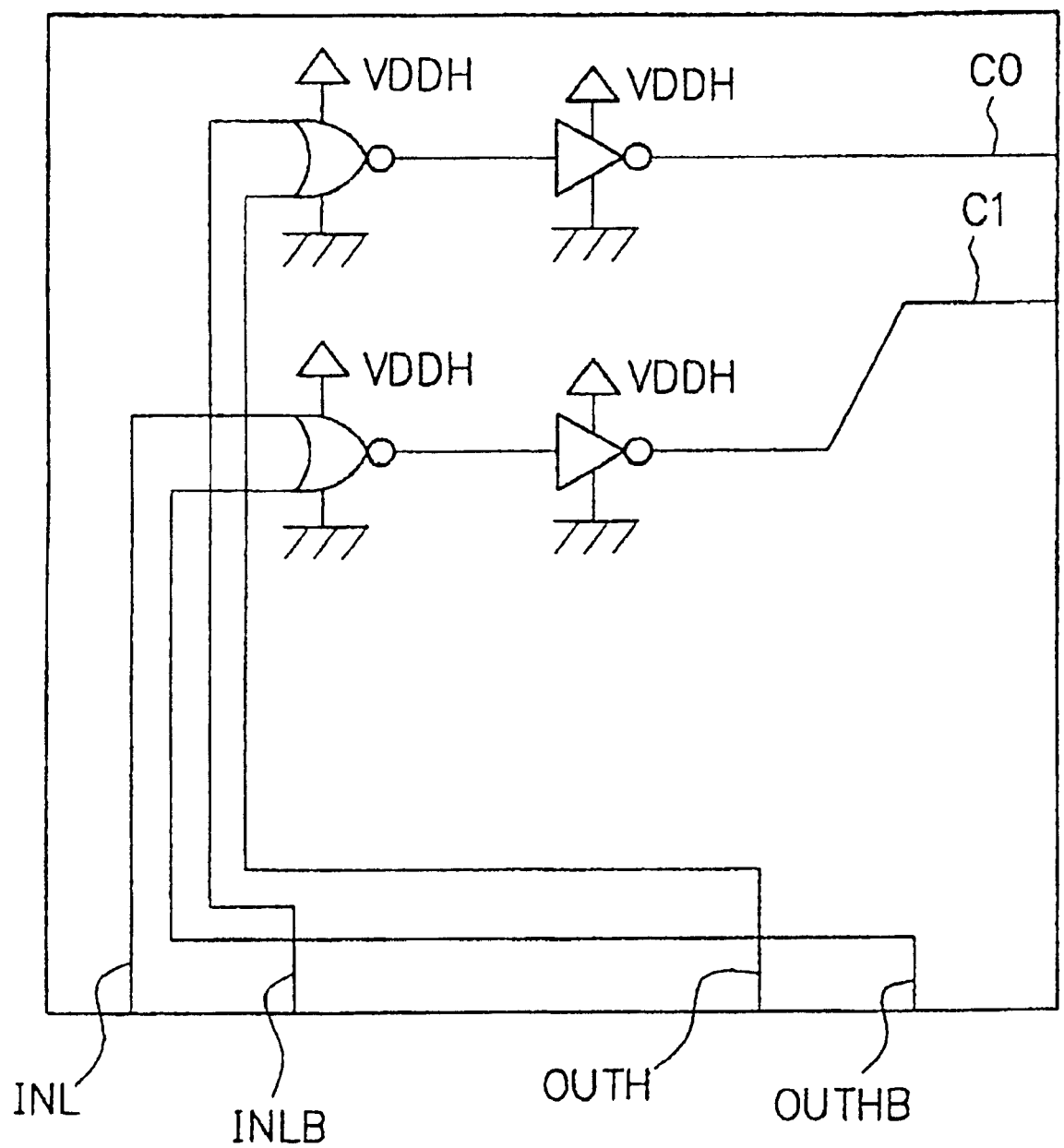
FIG. 6 is a circuit diagram showing another example of a control circuit according to the second embodiment of the present invention.
Figure 18:
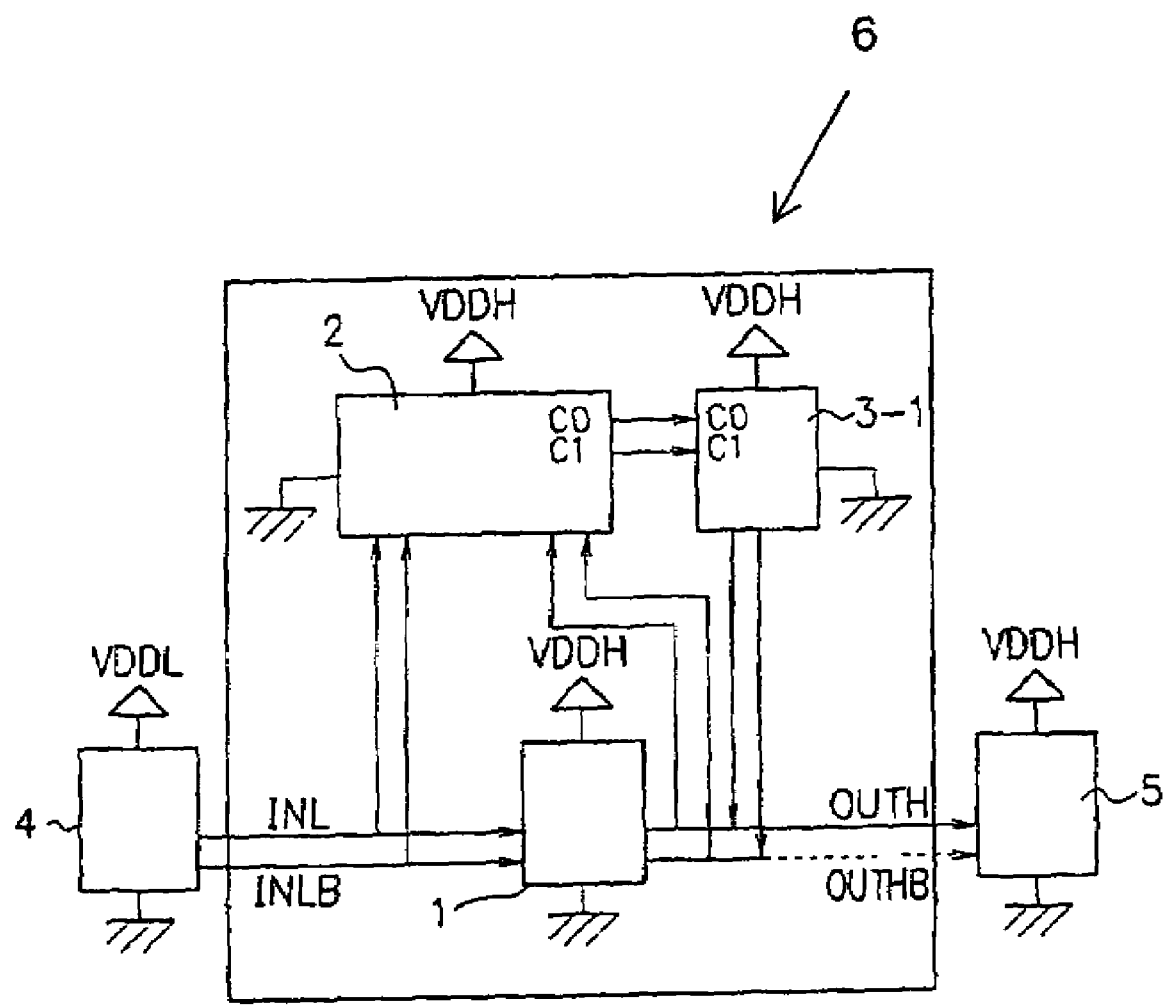
FIG. 18 is a diagram showing the circuitry of a level shift circuit according to the second embodiment of the present invention.
Figure 19:
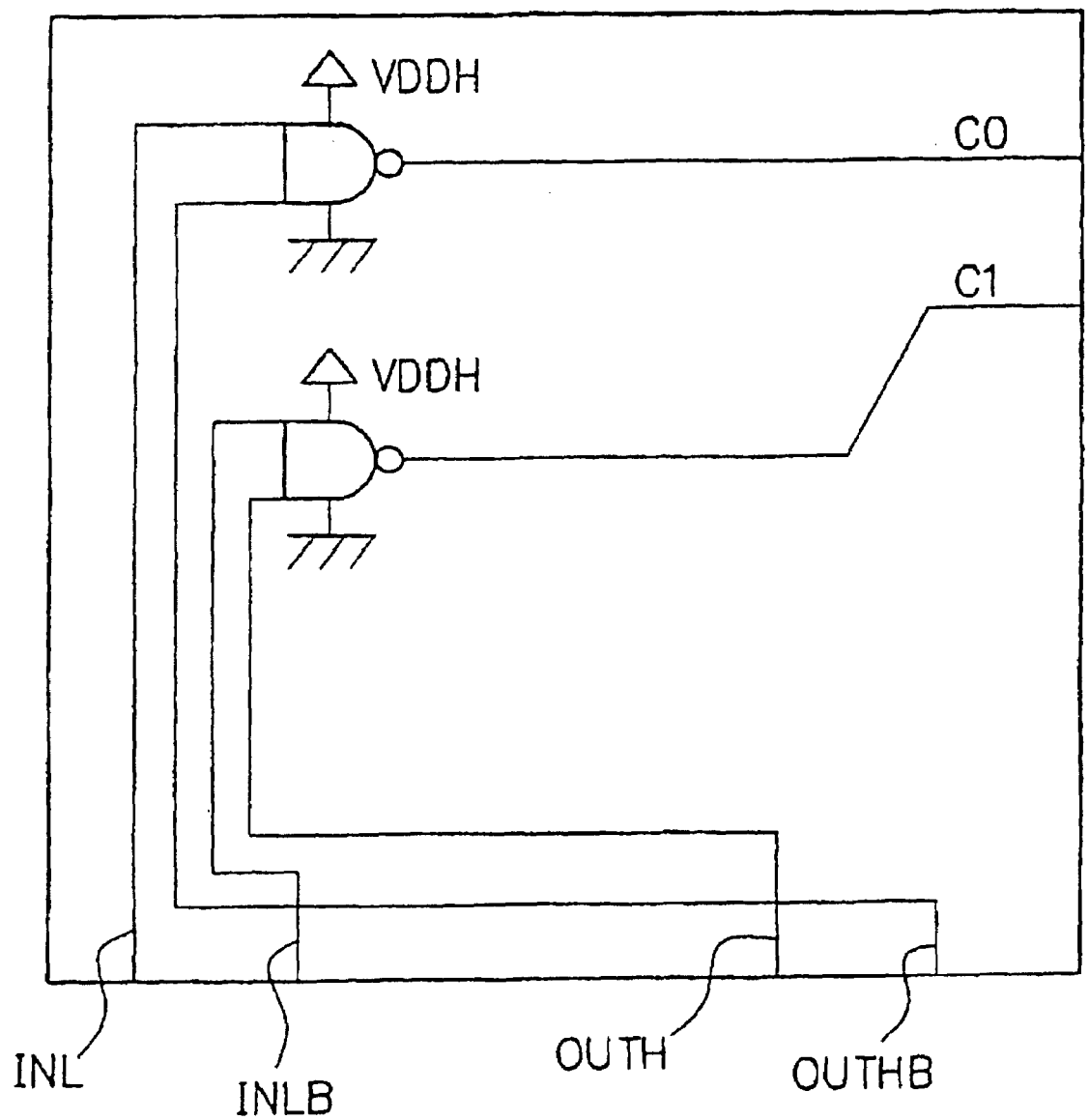
FIG. 19 is a circuit diagram showing an example of a control circuit according to the second embodiment of the present invention.

A description will be given of a level shift circuit 6 according to the second embodiment of the present invention. According to this embodiment, the pull-down function of the pull-up and/or pull-down circuit 3 in the first embodiment can be omitted as shown in FIG. 18. In the circuitry exemplified in FIG. 18, a pull-up circuit of FIG. 20 may be used in combination with the control circuit 2 shown in FIG. 6 or 19, or a pull-up circuit 3-1 of FIG. 22 may be used in combination with a control circuit shown in FIG. 21. The control circuit shown in FIG. 21 may be substituted with another control circuit that outputs the control signals CO and C1, as, for example, the one shown in FIG. 6 or 19. However, when such a substitute has been provided, the pull-up circuit 3-1 shown in FIG. 22 is replaced with the pull-up circuit 3-1 shown in FIG. 20 with a polarity opposite to that of the circuit 3-1 of FIG. 22.

Operation Example of the Second Embodiment

In the following, an example of the operation of the second embodiment will be described. It is assumed that, as shown in the timing chart of FIG. 23, INL is low, INLB is high, OUTH is low, and OUTHB is high in the initial state. In the case of using the function of the pull-up circuit only, as shown in FIG. 23, when INL has changed to high, the control circuit 2 outputs low CO so that the PMOS connected to OUTH turns on and pulls up OUTH. On the other hand, when OUTHB has been pulled down to low due to the operation of the level shift core circuit, the control circuit 2 outputs high CO, and accordingly, the PMOS turns off, thereby terminating the pull-up operation. As a result, INL becomes high, INLB becomes low, OUTH becomes high, and OUTHB becomes low.

Subsequently, when INLB has changed to high (INL has changed to low), the control circuit 2 outputs low C1 so that the PMOS connected to OUTHB turns on and pulls up OUTHB. On the other hand, when OUTH has been pulled down to low due to the operation of the level shift core circuit, the control circuit 2 outputs high C1, and accordingly, the PMOS turns off, thereby terminating the pull-up operation. Thus, INL becomes low, INLB becomes high, OUTH becomes low, and OUTHB becomes high, resulting in the initial state.

Modified Example of the Second Embodiment

Figure 4:
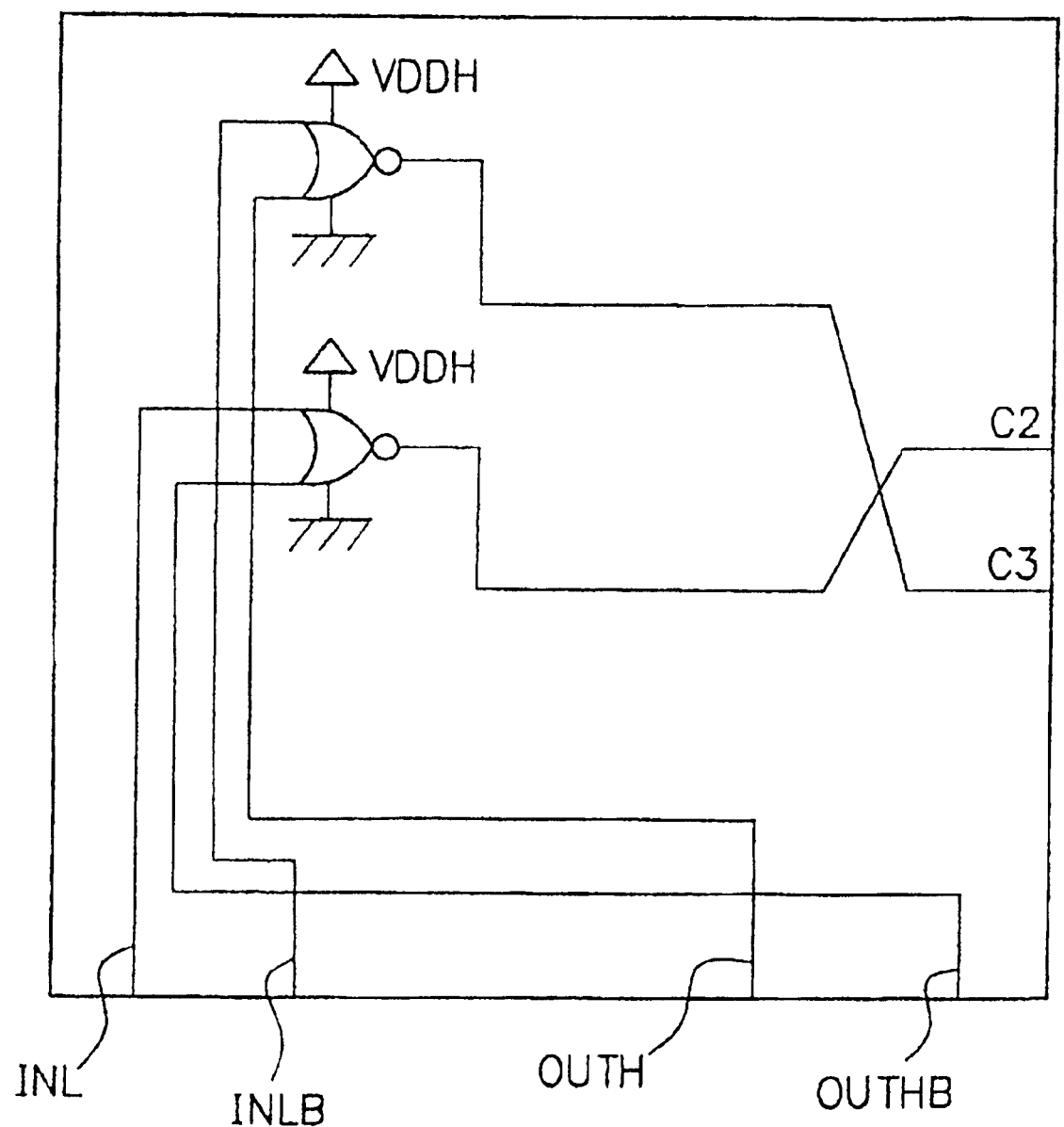
FIG. 4 is a circuit diagram showing another example of a control circuit according to a modified example of the second embodiment of the present invention.
Figure 5:
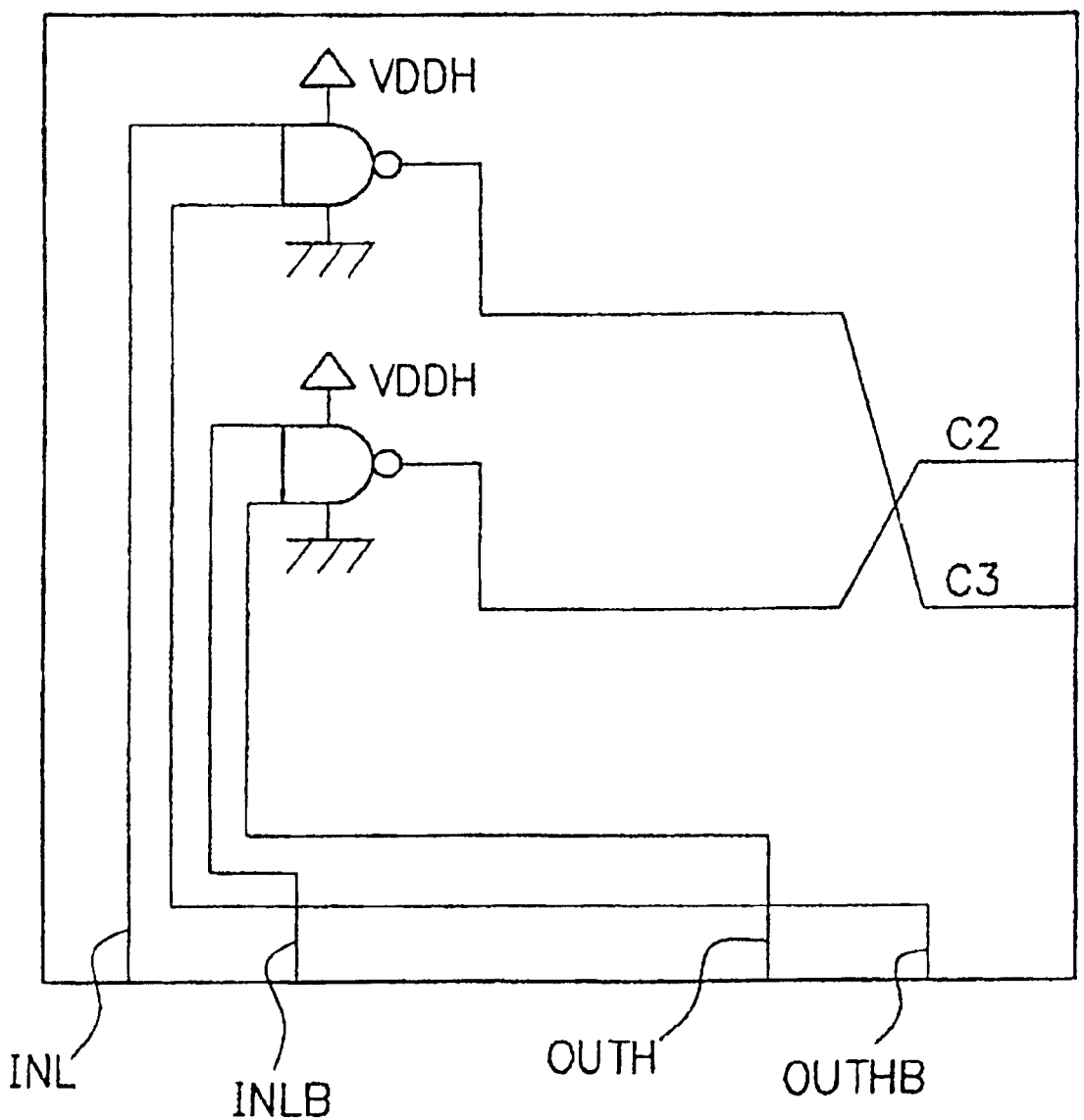
FIG. 5 is a circuit diagram showing yet another example of a control circuit according to a modified example of the second embodiment of the present invention.
Figure 25:
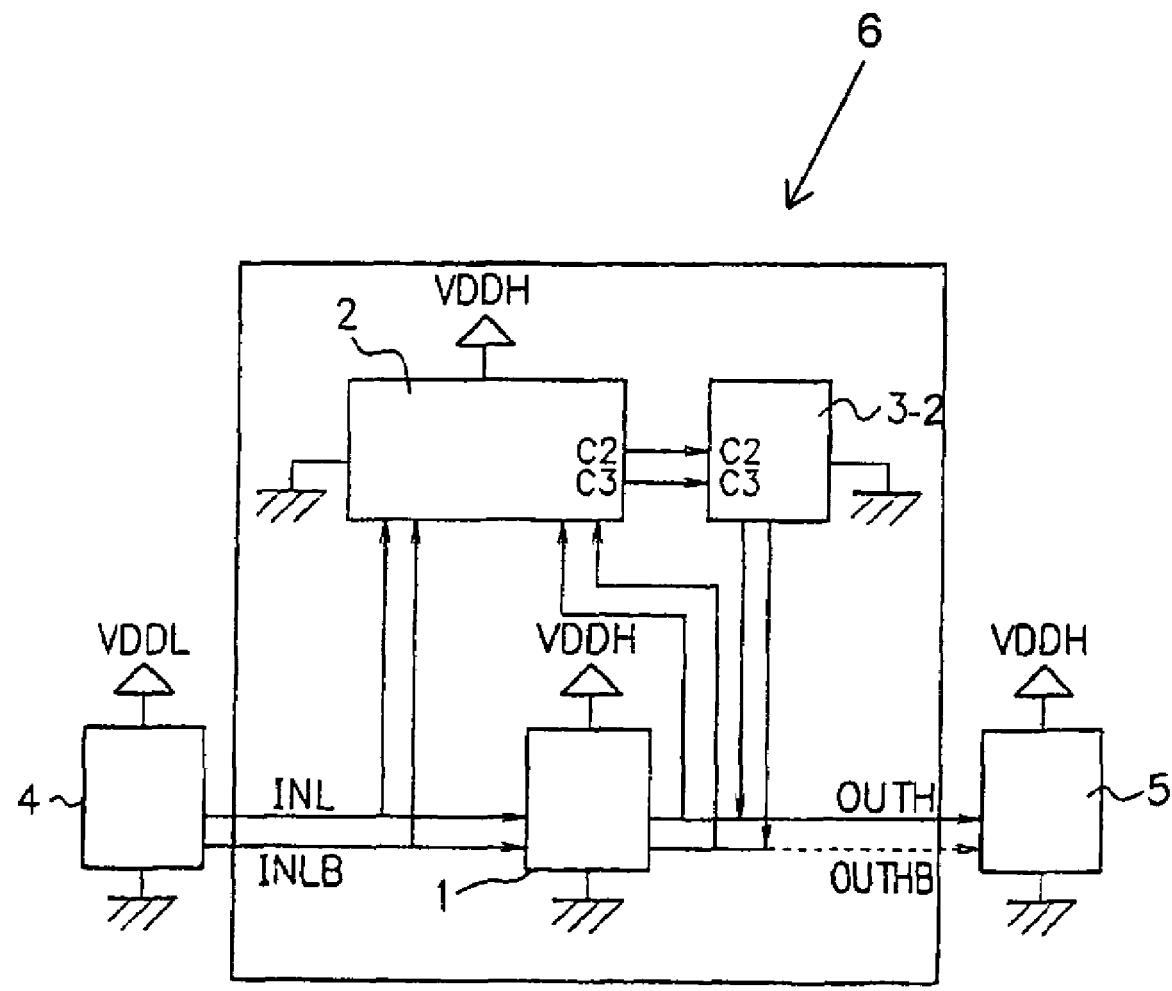
FIG. 25 is a diagram illustrating a modified example of the second embodiment of the present invention.
Figure 26:
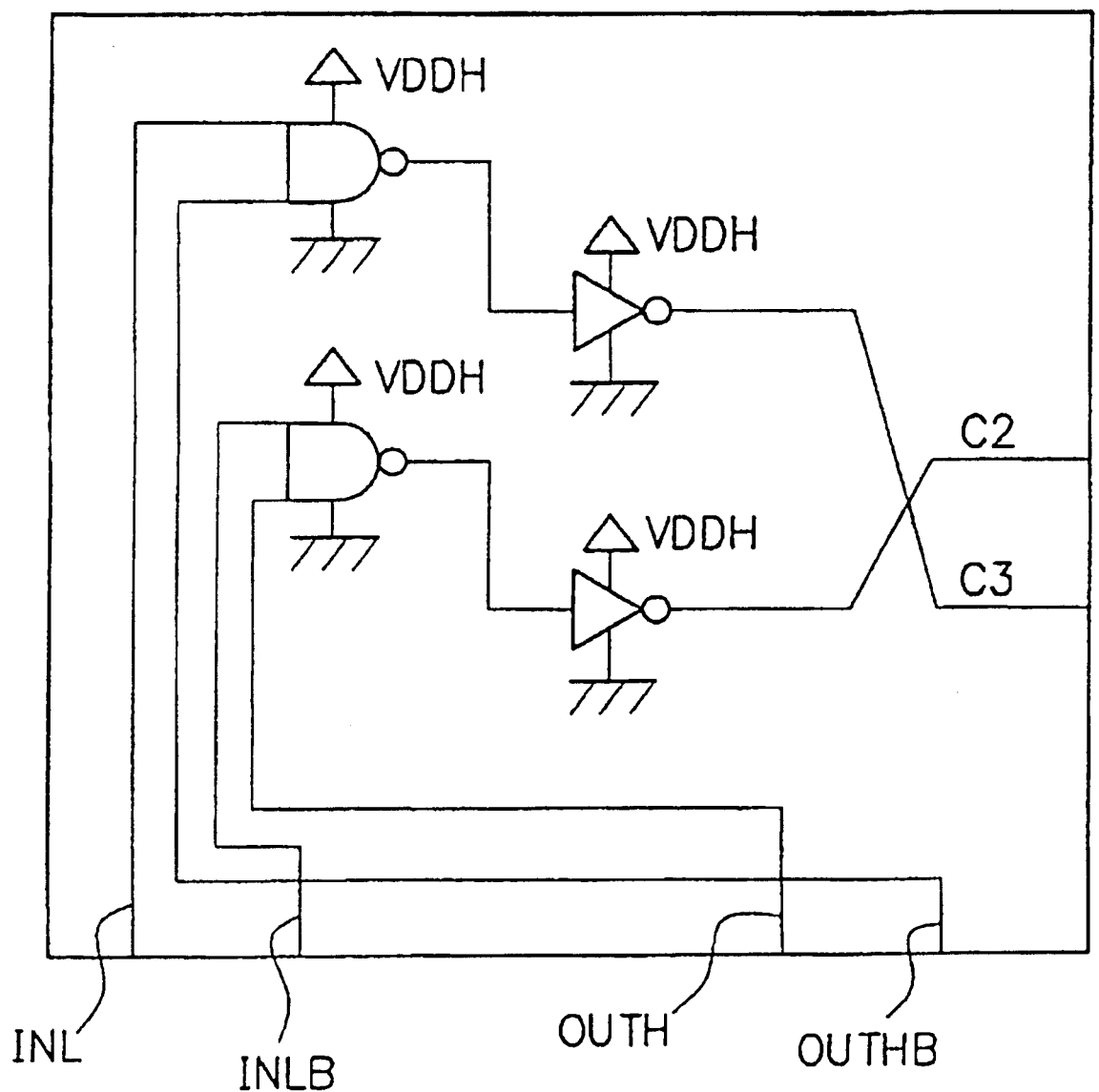
FIG. 26 is a circuit diagram showing an example of a control circuit according to a modified example of the second embodiment of the present invention.
Figure 28:
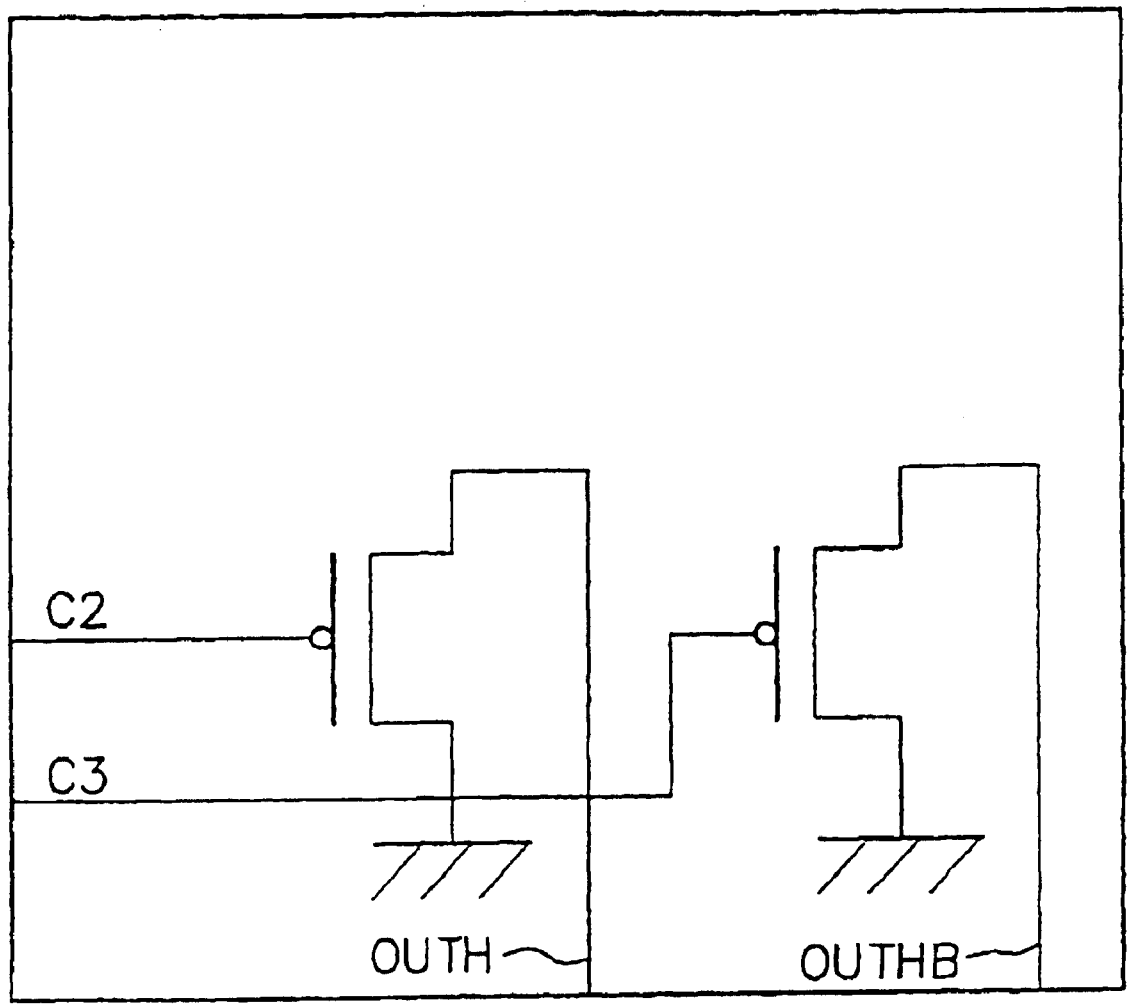
FIG. 28 is a circuit diagram showing another example of a pull-down circuit according to a modified example of the second embodiment of the present invention.

According to a modified example of the second embodiment, the pull-up function can be omitted as shown in FIG. 25 (in this case, a pull-down circuit 3-2 of FIG. 27 may be used in combination with a control circuit 2 shown in FIG. 4 or 26, or a pull-down circuit 3-2 of FIG. 28 may be used in combination with a control circuit 2 shown in FIG. 5). In this modified example, C2 and C3 are used as control signals.

The pull-down circuit 3-2 of FIG. 27 having an NMOS (transistor) construction may be substituted with the pull-down circuit 3-2 of FIG. 28 having a PMOS (transistor) construction. In other words, when the level shift core circuit 1 of FIG. 8 and the control circuit 2 of FIG. 5, instead of the circuit 2 of FIG. 4 or 26, are employed, a level shift circuit 6 can be constructed by replacing the pull-down circuit 3-2 shown in FIG. 27 with that shown in FIG. 28. However, the combination of these circuits has to be determined according to their polarity.

Figure 24:
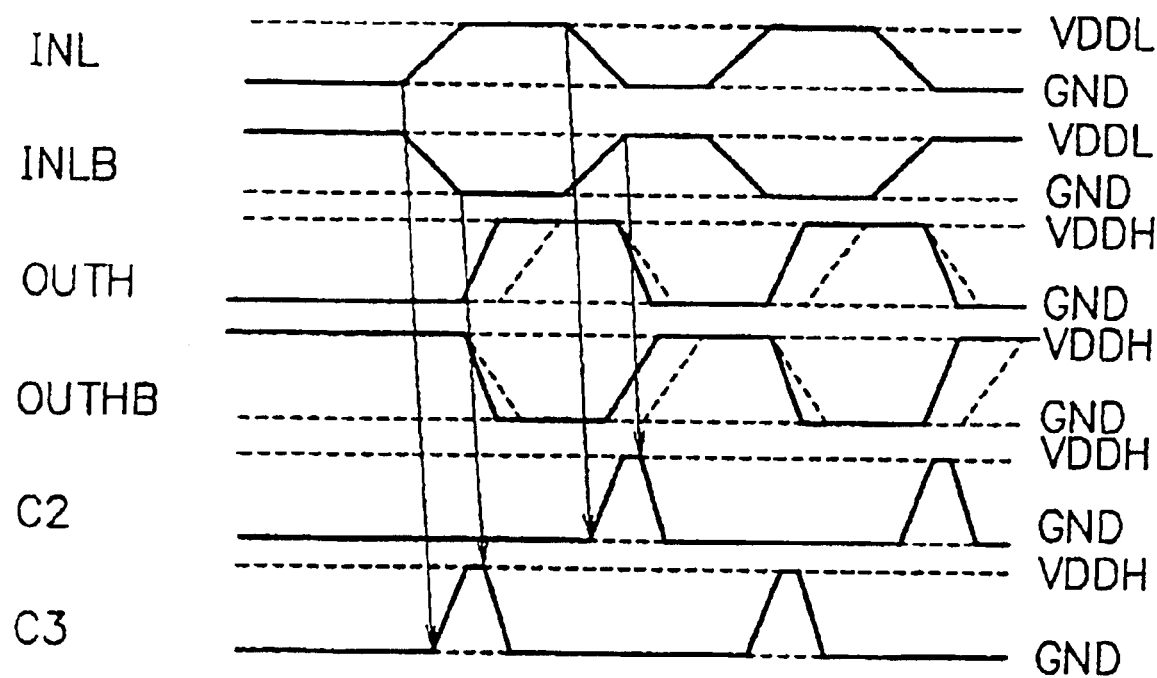
FIG. 24 is a timing chart showing the operation of a level shifter according to the third embodiment of the present invention (when the pull-down function is performed).

In the case of using the function of only the pull-down circuit according to the modified example of the second embodiment, as shown in FIG. 24, when INL is low, INLB is high, OUTH is low, and OUTHB is high and then INL has changed to high (INLB has changed to low), the control circuit 2 outputs high C3. Accordingly, the NMOS connected to OUTHB turns on and pulls down OUTHB. On the other hand, when OUTH has been pulled up to high due to the operation of the level shift core circuit, low C3 is output, and the NMOS turns off, thereby terminating the pull-down operation. As a result, INL becomes high, INLB becomes low, OUTH becomes high, and OUTHB becomes low.

Subsequently, when INLB has changed to high (INL has changed to low), high C2 is output so that the NMOS connected to OUTH turns on and pulls down OUTH. On the other hand, when OUTHB has been pulled up to high due to the operation of the level shift core circuit, low C2 is output. Accordingly, the NMOS turns off, thereby terminating the pull-down operation. Thus, INL becomes low, INLB becomes high, OUTH becomes low, and OUTFB becomes high.

As is described above, in response to a change of the level shift input, each level shift output is pulled-up/pulled-down as required by the pull-up or pull-down circuit and the control circuit fed from the second power supply. Consequently, the operation of the level shift core circuit can be supplemented.

Therefore, even when the potential difference between the first and second power supplies increases, the margin of level shift operation can be ensured. Besides, it becomes possible to suppress the increase of delays.

In this embodiment, two types of signals are utilized as control signals to implement circuitry capable of level shifting. As the two types of signals, two of the control signals C0 to C3 used in the first embodiment may be used. Besides, through the use of such control circuit 2 as outputs the two control signals C0 and C1, the constructions shown in FIG. 18 and, for example, FIG. 25 may be achieved. Further, this embodiment includes a construction in which the control circuit 2 performs control functions with two types of signals, and the pull-up and/or pull-down circuit 3 is controlled or changed based on the control signals output from the control circuit.

Third Embodiment

Figure 29:
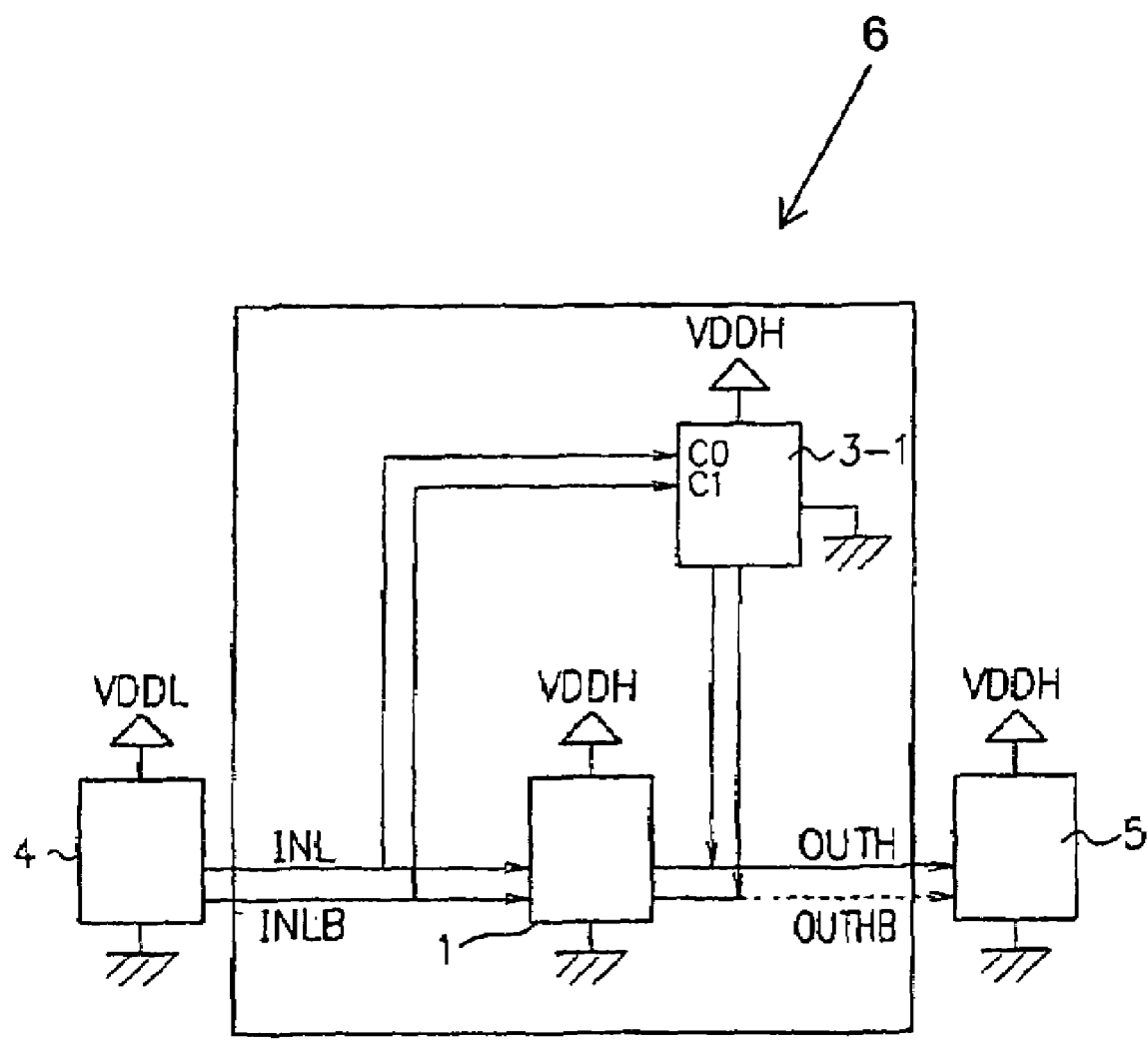
FIG. 29 is a diagram showing the circuitry of a level shifter according to the third embodiment of the present invention.

As can be seen in FIG. 29, a level shift circuit 6 according to the third embodiment of the present invention comprises a pull-up circuit 3-1 for performing pull-up operation based on signals INL or INLB output from the first logic circuit 4 fed from the first power supply VDDL, and a level shift core circuit fed from the second power supply VDDH which receives the signal(s) INL and/or INLB as well as outputting (a) signal(s) OUTH and/or OUTHB. The signal(s) OUTH and/or OUTHB are/is output to the second logic circuit fed from the external second power supply.

Figure 30:
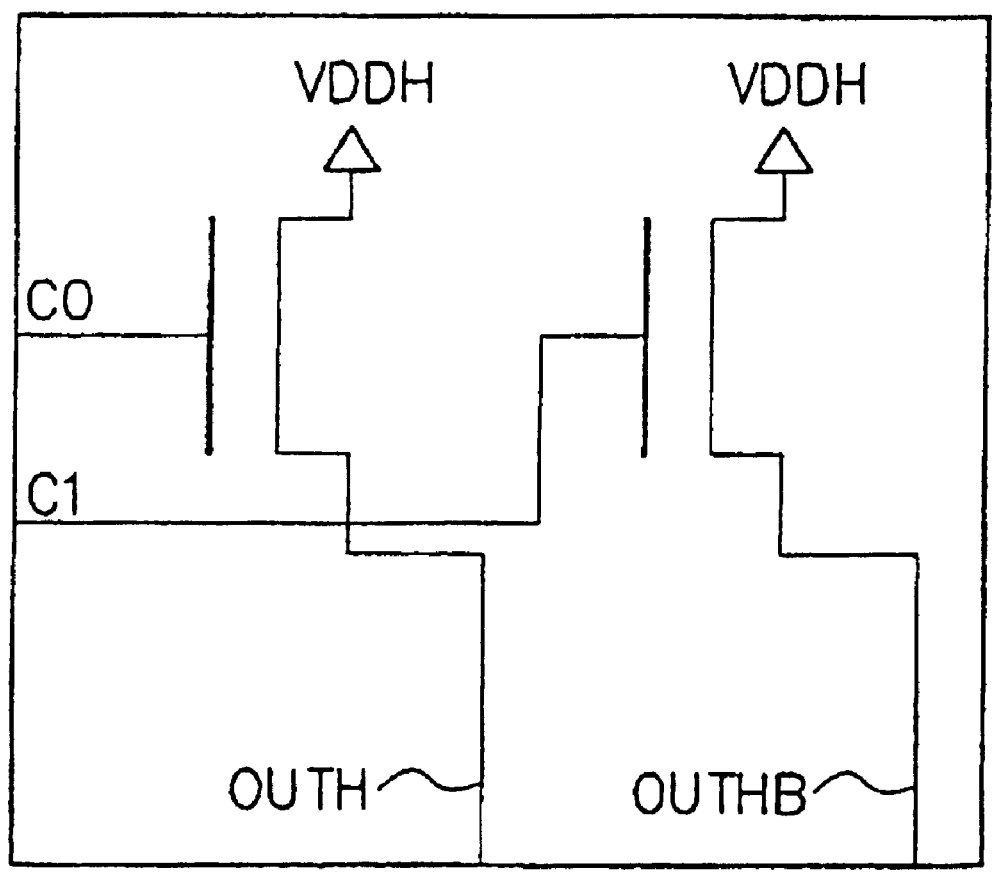
FIG. 30 is a circuit diagram showing an example of a pull-up circuit according to third embodiment of the present invention.
Figure 31:
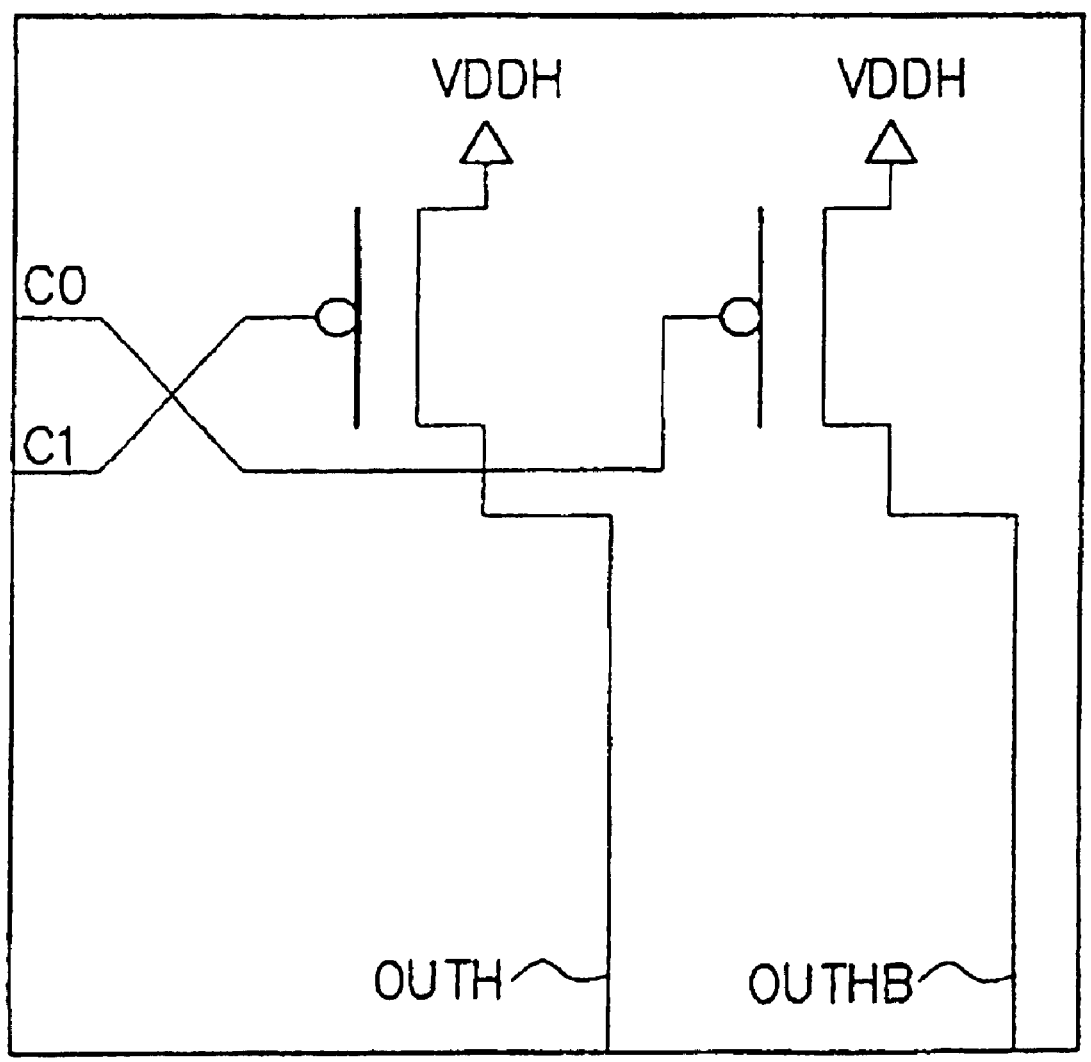
FIG. 31 is a diagram showing another example of a pull-up circuit according to third embodiment of the present invention.

The third embodiment corresponds to the second embodiment in which the pull-down function is omitted. In this embodiment, the control circuit 2 can also be omitted. In this manner, when the level shift input is directly connected to the pull-up circuit fed from the second power supply, the drain-source voltage can be increased, and thus the level shifter of this embodiment performs a level shift efficiently (the drain current increases as the drain-source voltage increases even in the saturation region). In this case, a pull-up circuit as shown in FIG. 30 or 31 may be used, and especially, with the pull-up circuit of FIG. 31, off leakage current can be reduced in a region where the threshold voltage of each P-MOS is not more than the value of VDDL-VDDH.

In the following, a description will be given of the operation of the level shift circuit 6 according to the third embodiment of the present invention. It is assumed that, as shown in the timing chart of FIG. 13, INL is low, INLB is high, OUTH is low, and OUTHB is high in the initial state. When INL (an input signal to the pull-up circuit, and referred to as C0) output from the first logic circuit 4 has changed to high, the NMOS connected to OUTH turns on in the pull-up circuit 3-1 and pulls up OUTH. At this time, since INLB (an input signal to the pull-up circuit, and referred to as C1) is low, the other NMOS connected to OUTHB is off. Subsequently, when OUTHB has been pulled down to low due to the operation of the level shift core circuit 1, high CO is output. Accordingly, the NMOS of the pull-up circuit 3-1 turns off, thereby terminating the pull-up operation. As a result, INL becomes high, INLB becomes low, OUTH becomes high, and OUTHB becomes low.

Next, when INL output from the first logic circuit 4 has changed to high (INLB has changed to low), the low signal INLB (C1) is output, and the NMOS connected to OUTHB turns on in the pull-up circuit 3-1 to pull up OUTHB. After that, high C1 is output, and the NMOS of the pull-up circuit 3-1 turns off, thereby terminating the pull-up operation. Thus, INL becomes low, INLB becomes high, OUTH becomes low, and OUTHB becomes high, resulting in the initial state. The description has been made of the case where the pull-up circuit 3-1 of FIG. 30 is employed. In the case of the pull-up circuit 3-1 shown in FIG. 31, the PMOS which receives the signal INL through its gate is provided with the signal OUTHB, while the PMOS which receives the signal INLB through its gate is provided with the signal OUTH. In the level shift circuit, the pull-up circuit having such PMOSs operates in essentially the same manner as the pull-up circuit 3-1 having NMOSs. However, the PMOS is opposite in polarity to the NMOS, and the pull-up circuit performs the ON/OFF operation in reversed way as compared to the basic operation of the pull-up circuit 3-1 described above.

Fourth Embodiment

Figure 32:
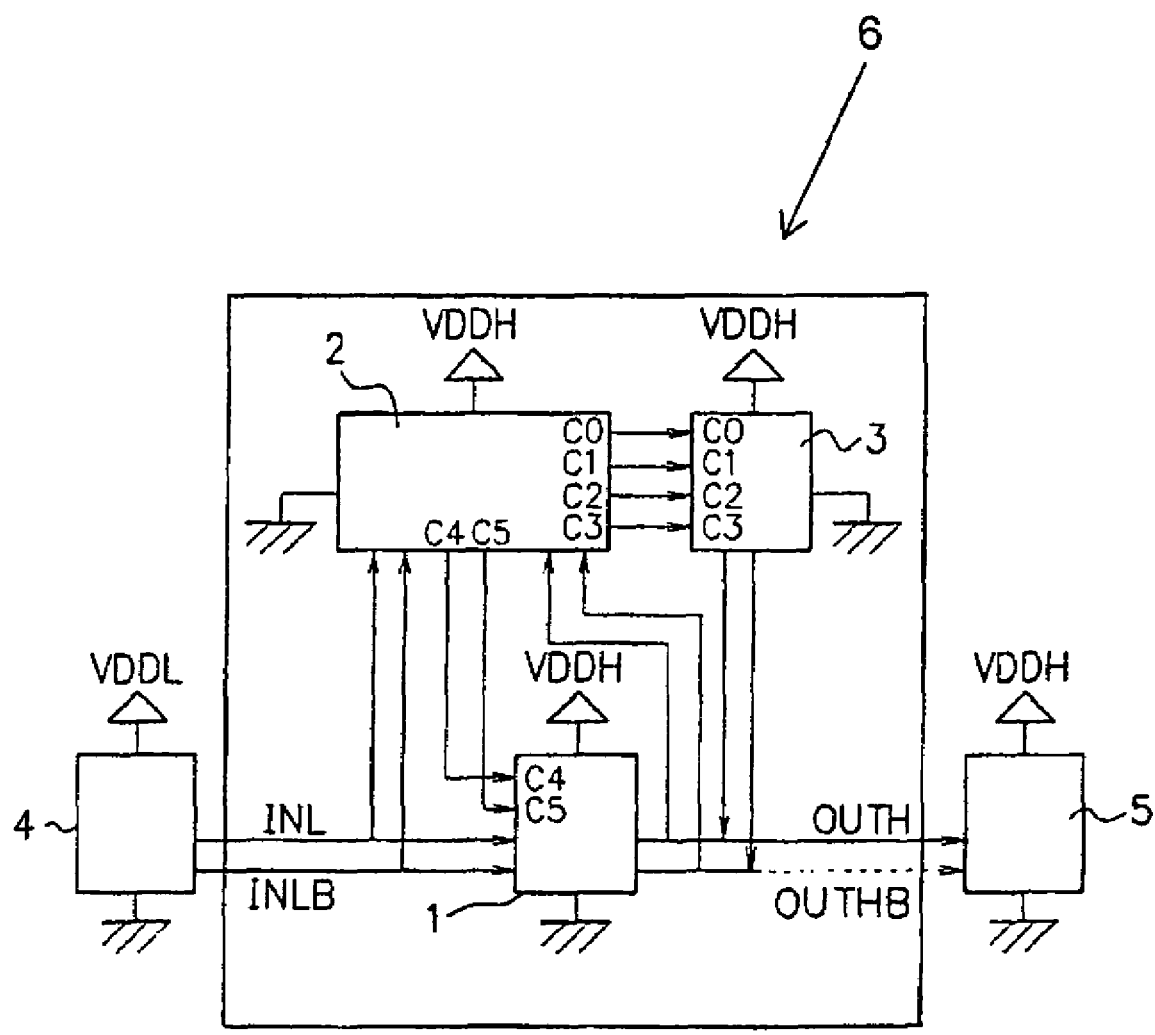
FIG. 32 is a diagram showing an example of the construction of a level shifter according to the fourth embodiment of the present invention.

A level shift circuit of the fourth embodiment is similar in basic construction to those in the foregoing embodiments. In this embodiment, the control circuit 2, which is used according to the construction of the level shift core circuit 1, is further elaborated. FIG. 32 shows the construction of the level shift circuit.

In FIG. 32, the level shift circuit 6 has an additional function to generate control signals for the PMOS switches of the level shift core circuit shown in FIG. 16.

Figure 34:
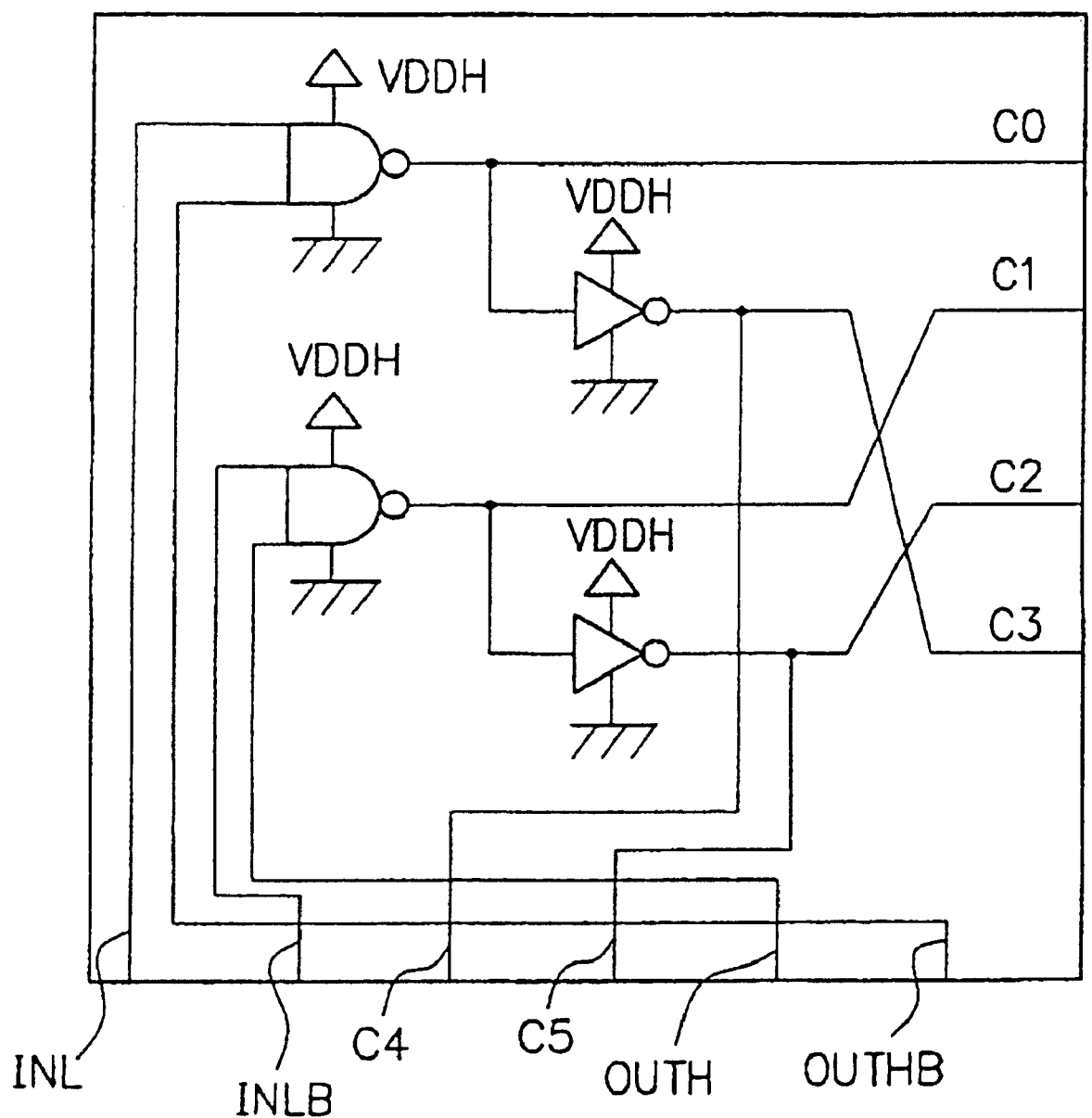
FIG. 34 is a circuit diagram showing an example of a control circuit according to the forth embodiment of the present invention.

FIGS. 33 and 34 show examples of the level shift core circuit 1 and the control circuit 2, respectively. In the fourth embodiment, the pull-up circuit 3-1 selected from those of FIGS. 20, 22, 30 and 31 and either one of the pull-down circuit 3-2 of FIG. 27 or 28 may be utilized, preferably, however, the pull-up and/or pull-down circuit 3 shown in FIG. 10 is utilized. FIG. 35 is a timing chart showing the operation of a level shifter provided with the level shift core circuit 1 and the control circuit 2.

In the case where INL is low, INLB is high, OUTH is low, and OUTHB is high, when the INL signal output from the first logic circuit 4 has changed to high (INLB has changed to low), the control circuit 2 outputs the C0 signal and the like in response to the input of the INL signal. The low C0 output turns on the PMOS connected to OUTH in the pull-up and/or pull-down circuit 3, and the PMOS pulls up OUTH. Besides, the control circuit 2 outputs high C3 to resultantly cause the NMOS connected to OUTHB in the pull-up and/or pull-down circuit 3 to turn on and pull up OUTHB. In addition, the control circuit 2 outputs high C4 to disconnect the PMOS cross-coupled connection that maintains OUTHB high in the level shift core circuit. On the other hand, when OUTHB has been pulled down to low due to the operation of the level shift core circuit 1, the control circuit 2 outputs high C0 so that the PMOS of the pull-up and/or pull-down circuit 3 turns off to terminate the pull-up operation as well as outputting low C3 so that the NMOS of the pull-up and/or pull-down circuit 3 turns off to terminate the pull-down operation. The control circuit 2 also outputs low C4 to turn on the PMOS switch in the level shift core circuit. As a result, INL becomes high, INLB becomes low, OUTH becomes high, and OUTHB becomes low.

Subsequently, when INLB output from the external first logic circuit 4 has changed to high (INL has changed to low), the control circuit 2 outputs low C1 in response to the input of the signal. Accordingly, the PMOS connected to OUTHB in the pull-up and/or pull-down circuit 3 turns on to pull up OUTHB. Besides, the control circuit 2 outputs high C2, and the NMOS connected to OUTH in the pull-up and/or pull-down circuit 3 turns on to pull down OUTH. In addition, the control circuit 2 outputs high C5 to disconnect the PMOS cross-coupled connection that maintains OUTH high in the level shift core circuit. On the other hand, when OUTH has been pulled down to low due to the operation of the level shift core circuit 1, the control circuit 2 outputs high C1 so that the PMOS of the pull-up and/or pull-down circuit 3 turns off to terminate the pull-up operation as well as outputting low C2 so that the NMOS of the pull-up and/or pull-down circuit 3 turns off to terminate the pull-down operation. The control circuit 2 also outputs low C5 to turn on the PMOS switch in the level shift core circuit. As a result, INL becomes low, INLB becomes high, OUTH becomes low, and OUTHB becomes high. Incidentally, the description has been made of the case where the pull-up and/or pull-down circuit 3 having NMOSs (transistors) and PMOSs (transistors) as described previously in connection with FIG. 10 is employed. In the case, however, where the NMOSs are replaced by PMOSs and/or the PMOSs are replaced by NMOSs, the connections with the OUTH and OUTHB signals are changed, and these changes are reflected in the above-described operation.

As is described above, according to the fourth embodiment of the present invention, the PMOS cross-coupled connection can be yet further weakened when the level shift input has changed. Moreover, the margin of level shift operation can be ensured, and the operation can be performed at a higher speed. Furthermore, through-current can be reduced. That is, in accordance with the present invention, the rise and fall time (the angle of the rising or falling edge) of OUTH or OUTHB as indicated with dotted lines in FIG. 35, observed in a general level shift circuit, can be accelerated (steepened) as indicated with solid lines, and also rise or fall timing can be advanced. In this construction, instead of the circuitry of FIG. 34, the control circuit 2 may have NOR circuitry as shown in FIG. 36. The level shift core circuit 1 shown in FIG. 33 is utilized when the control circuit 2 of FIG. 36 is adopted.

Modified Example of the Fourth Embodiment

In the pull-up and/or pull-down circuit 3 of the present invention, either one of the functions can be omitted. In this case, the pull-up circuit 3-1 selected from those of FIGS. 20, 22, 30 and 31 and one of the pull-down circuits 3-2 of FIGS. 27 and 28 may be utilized. Also, such level shift core circuit 1 as shown in FIG. 33, employed in the fourth embodiment, may be used. Depending on the selected pull-up circuit 3-1 or the pull-down circuit 3-2, the control circuit 2 may be selected for use so as to be paired with the pull-up circuit 3-1 or the pull-down circuit 3-2 described previously in the second embodiment, the modified example of the second embodiment or the third embodiment.

If the pull-up circuit 3-1 is selected, the level shift circuit or level shifter of the modified example of the fourth embodiment operates as shown in the timing chart of FIG. 23. Meanwhile, if the pull-down circuit 3-2 is selected, the level shift circuit or level shifter of this embodiment operates as shown in the timing chart of FIG. 24 or 37.

More specifically, if the pull-up circuit 3-1 is selected, in the case where INL is low, INLB is high, OUTH is low, and OUTHB is high, as shown in FIG. 23, when the INL signal output from the first logic circuit 4 has changed to high (INLB has changed to low), the control circuit 2 outputs the C0 signal and the like in response to the input of the INL signal. The low C0 output turns on the PMOS connected to OUTH in the pull-up circuit 3-1, and the PMOS pulls up OUTH. Further, the control circuit 2 outputs high C4 to turn off the PMOS switch connected to OUTHB in the level shift core circuit, thereby inhibiting OUTHB from being pulled up. On the other hand, when OUTHB has been pulled down to low due to the operation of the level shift core circuit 1, the control circuit 2 outputs high C0 so that the PMOS of the pull-up circuit 3-1 turns off to terminate the pull-up operation. As a result, INL becomes high, INLB becomes low, OUTH becomes high, and OUTHB becomes low.

Figure 20:
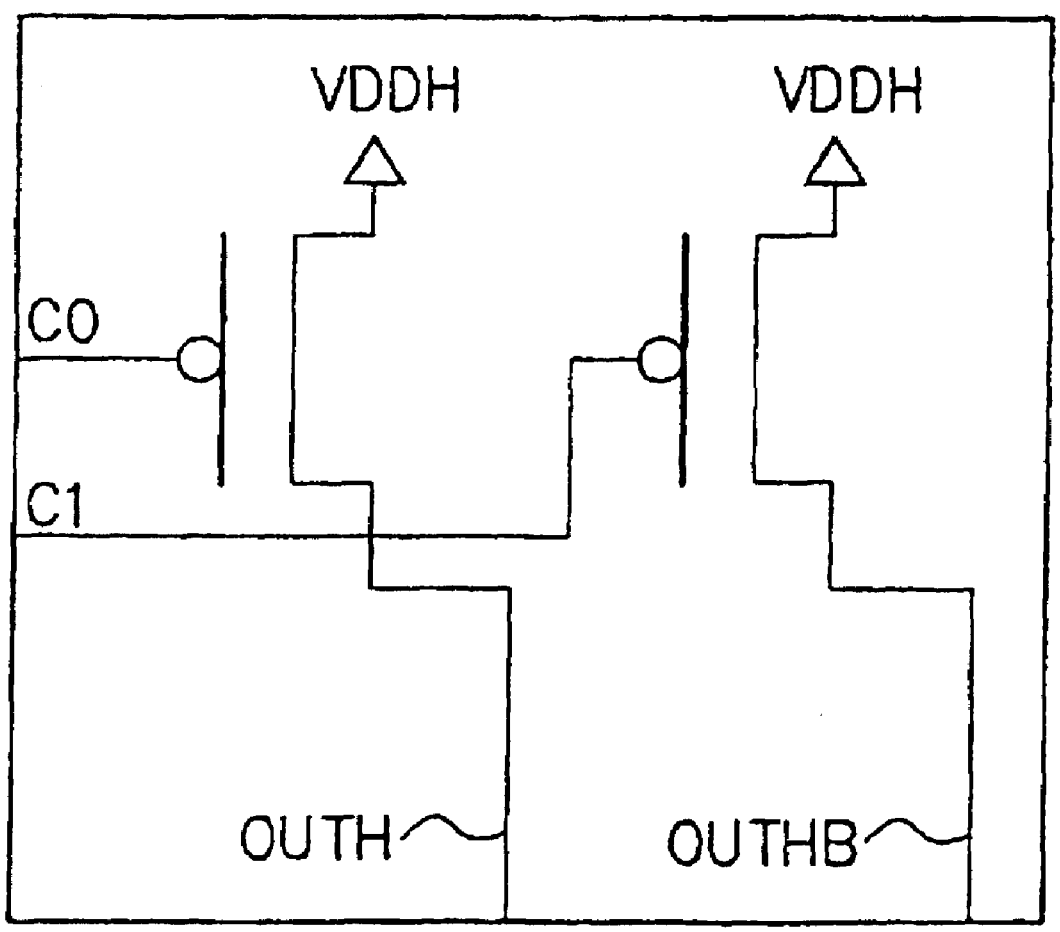
FIG. 20 is a circuit diagram showing an example of a pull-up circuit according to the second embodiment of the present invention.
Figure 21:
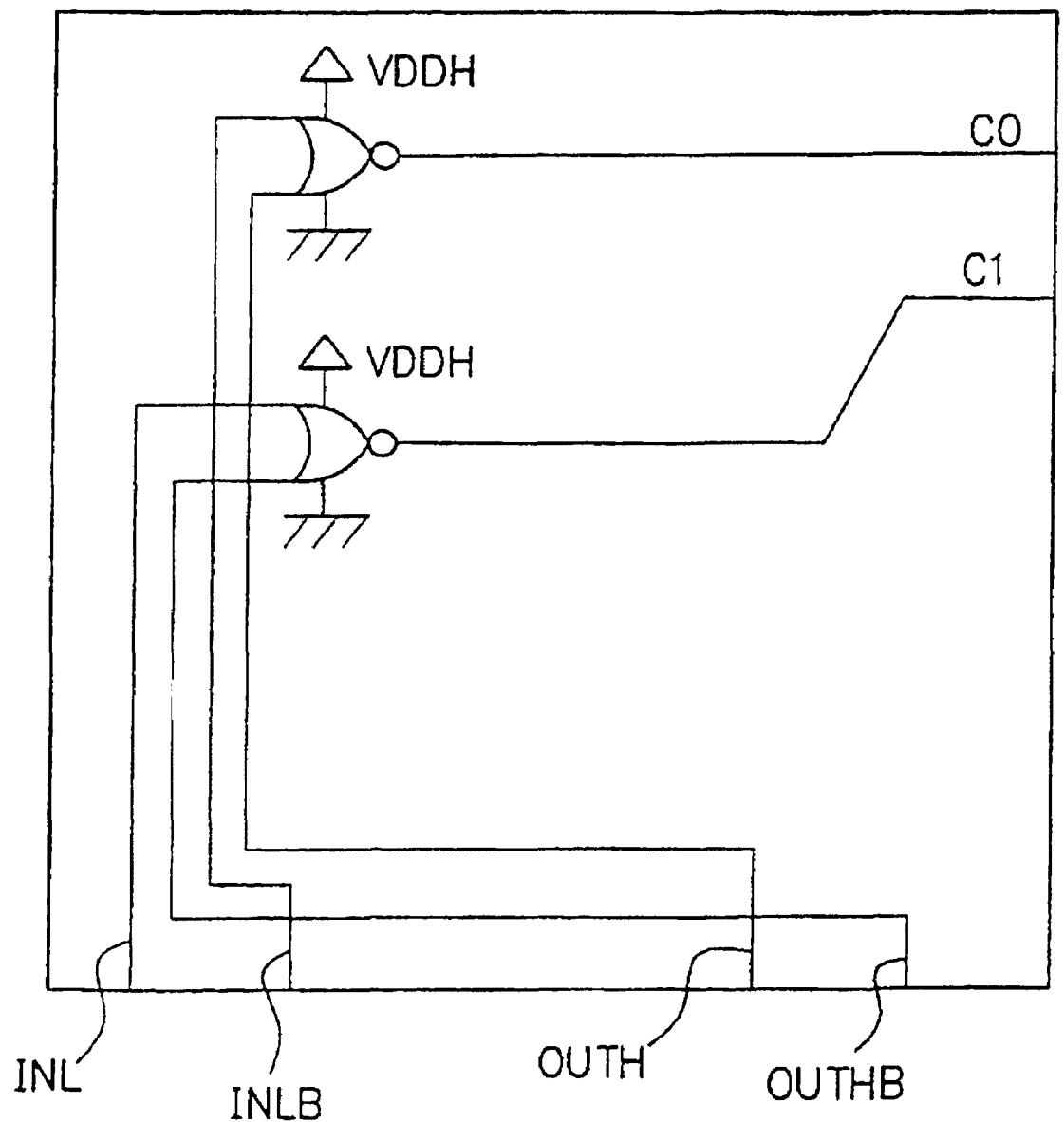
FIG. 21 is a circuit diagram showing another example of a control circuit according to the second embodiment of the present invention.

Subsequently, when INLB output from the external first logic circuit 4 has changed to high (INL has changed to low), the control circuit 2 outputs low C1 in response to the input of the signal. Accordingly, the PMOS connected to OUTHB in the pull-up circuit 3-1 turns on to pull up OUTHB. Further, the control circuit 2 outputs high C5 to turn off the PMOS switch connected to OUTH in the level shift core circuit, thereby inhibiting OUTH from being pulled up. On the other hand, when OUTH has been pulled down to low due to the operation of the level shift core circuit 1, the control circuit 2 outputs high C1 so that the PMOS of the pull-up circuit 3-1 turns off to terminate the pull-up operation. The control circuit 2 also outputs low C5 to turn on the PMOS switch in the level shift core circuit. As a result, INL becomes low, INLB becomes high, OUTH becomes low, and OUTHB becomes high. Incidentally, the description has been made of the case where the pull-up circuit 3-1 has the construction with PMOSs (transistors) as shown in FIG. 20. In the case, however, where the PMOSs are replaced by NMOSs and/or the NMOSs (as shown in FIG. 22 or 30) are replaced by PMOSs, the connections with the OUTH and OUTHB signals are changed, and these changes are reflected in the above-described operation.

Besides, if the pull-down circuit 3-2 is selected, in the case where INL is low, INLB is high, OUTH is low, and OUTHB is high, as shown in FIG. 24 or 37, when the INL signal output from the first logic circuit 4 has changed to high (INLB has changed to low), the control circuit 2 outputs the C3 signal and the like in response to the input of the INL signal. The high C3 output resultantly causes the NMOS connected to OUTHB to turn on in the pull-down circuit 3-2, and the NMOS pulls down OUTHB. On the other hand, when OUTH has been pulled up to high due to the operation of the level shift core circuit 1, the control circuit 2 outputs low C3 so that the NMOS of the pull-down circuit 3-2 turns off to terminate the pull-up operation. As a result, INL becomes high, INLB becomes low, OUTH becomes high, and OUTHB becomes low.

Subsequently, when INLB output from the external first logic circuit 4 has changed to high (INL has changed to low), the control circuit 2 outputs high C2 in response to the input of the signal. Accordingly, the PMOS connected to OUTH in the pull-down circuit 3-2 turns on to pull down OUTH. On the other hand, when OUTH has been pulled down to low due to the operation of the level shift core circuit 1, the control circuit 2 outputs low C2 so that the NMOS of the pull-down circuit 3-2 turns off to terminate the pull-down operation. As a result, INL becomes low, INLB becomes high, OUTH becomes low, and OUTHB becomes high. Incidentally, the description has been made of the case where the pull-down circuit 3-2 has the construction with NMOSs (transistors) as shown in FIG. 27. In the case, however, where the NMOSs are replaced by PMOSs and/or the PMOSs (as shown in FIG. 28) are replaced by NMOSs, the connections with the OUTH and OUTHB signals are changed, and these changes are reflected in the above-described operation.

Fifth Embodiment

In this embodiment, the level shift core circuit 1 of FIG. 33 used in the fourth embodiment is employed, and both the pull-up and pull-down circuits are omitted as shown in FIG. 38. In the fifth embodiment, the same level shift core circuit 1 and control circuit 2 as described previously in the fourth embodiment can be utilized. Concretely, the level shift core circuit 1 shown in FIG. 33 and the control circuit 2 shown in FIG. 34 or 36 are adopted. That is, the level shift circuit 6 of the fifth embodiment comprises the level shift core circuit 1 and the control circuit 2. The control circuit 2 is fed from the second power supply VDDH and receives the signals INL and INLB output from the first logic circuit as well as outputting control signals (C4, C5, etc.) for controlling the level shift core circuit 1. The level shift core circuit 1, fed from the second power supply VDDH, receives the signals output from the control circuit and the signals INL and INLB from the first logic circuit as well as outputting the signals OUTH and OUTHB for controlling the second logic circuit. The signals OUTH and OUTHB output from level shift core circuit are supplied to the control circuit. As just described, such control circuit as needs no inverter circuit to output the control signals C4 and C5 may be employed.

The level shift circuit 6 of the fifth embodiment operates as shown in the timing chart of FIG. 37.

More specifically, in the case where INL is low, INLB is high, OUTH is low, and OUTHB is high, when the INL signal output from the first logic circuit has changed to high (INLB has changed to low), the control circuit 2 outputs high C4 to turn off the PMOS switch connected to OUTHIB in the level shift core circuit 1, thereby inhibiting OUTHB from being pulled up. On the other hand, when OUTHIB has been pulled down to low due to the operation of the level shift core circuit 1, the control circuit 2 low C4 to turn on the PMOS switch in the level shift core circuit. As a result, INL becomes high, INLB becomes low, OUTH becomes high, and OUTHB becomes low.

Subsequently, when INLB output from the external first logic circuit 4 has changed to high (INL has changed to low), the control circuit 2 outputs high C5 to turn off the PMOS switch connected to OUTH in the level shift core circuit 1, thereby inhibiting OUTH from being pulled up. On the other hand, when OUTH has been pulled down to low due to the operation of the level shift core circuit 1, the control circuit 2 also outputs low C5 to turn off the NMOS in the level shift core circuit 1. As a result, INL becomes low, INLB becomes high, OUTH becomes low, and OUTHB becomes high. Incidentally, the description has been made of the case where the level shift core circuit 1 having NMOSs (transistors) and PMOSs (transistors) as described previously in connection with FIG. 33 is employed. In the case, however, the NMOSs are replaced by PMOSs and/or the PMOSs are replaced by NMOSs, the connections with the OUTH and OUTHB signals are changed, and these changes are reflected in the above-described operation.

Even when both the pull-up and pull-down circuits are omitted from circuitry, the PMOS switches can be fully controlled by the output of the control circuit at the second power supply level. Thus, the margin of level shift operation can be improved efficiently.

In the fifth embodiment, the level shift core circuit 1 may be replaced by another one having functions equivalent to those of the circuit 1. Incidentally, it is to be appreciated that the present invention is not restricted by the above embodiments, and the embodiments can be changed or modified without departing from the scope and spirit of the present invention. It is obvious that the present invention includes such changed or modified embodiments. Additionally, a circle (o) indicates the gate of each PMOS transistor throughout the drawings.

In the first to fifth embodiments described above, at least one of the control signals OUTH and OUTHB may be used to control the second logic circuit. In other words, either one of OUTH and OUTHB or both OUTH and OUTHB may be adopted to control the second logic circuit as appropriate.

INDUSTRIAL APPLICABILITY

As set forth hereinabove, in accordance with the present invention, a level shift circuit, which changes the signal level in a first logic circuit fed from the first power supply into the signal level in a second logic circuit fed from the second power supply, comprises a level shift core circuit fed from the second power supply, a control circuit fed from the second power supply, and a pull-up and/or pull-down circuit fed from the second power supply. By virtue of the basic construction, a level shift can be performed while suppressing the increase of delays as well as ensuring the margin of level shift operation even when the potential difference between the first and second power supplies increases.

Further, in accordance with the present invention, a level shift circuit comprises a level shift core circuit, a control circuit for outputting control signals to control the level shift core circuit, and/or a pull-up and/or pull-down circuit controlled by the level shift core circuit. By virtue of the basic construction, a level shift can be performed while suppressing the increase of delays as well as ensuring the margin of level shift operation even when the potential difference between the first and second power supplies increases.

The invention claimed is:

1. A level shift circuit for changing the signal level in a first logic circuit fed from a first power supply to the signal level in a second logic circuit fed from a second power supply, comprising:
   a level shift core circuit which is controlled by a control circuit; wherein:
   the level shift core circuit, being fed from the second power supply, receives level shift input signals output from the first logic circuit and control signals output from the control circuit and outputs level shift output signals to be input to the second logic circuit; the control circuit comprises: a first NOR circuit fed from the second power supply, which receives an inverted signal of the level shift input signals and a non-inverted signal of the level shift output signals; and a second NOR circuit fed from the second power supply, which receives a non-inverted signal of the level shift input signals and an inverted signal of the level shift output signals; where the control circuit outputs the output signals of the first and second NOR circuits as control signals to the level shift core circuit; and
   the level shift core circuit comprises: a PMOS cross-coupled latch including a first plurality of PMOSs, a differential PMOS switch including a second plurality of PMOSs, and a differential NMOS switch including a plurality of NMOSs:
   wherein each PMOS of the second plurality of PMOSs has a source connected to a drain of a PMOS of the first plurality of PMOSs, a drain connected to the level shift output, and a gate connected to one of the control signals from the control circuit;
   wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and
   wherein each NMOS of the differential NMOS switch has a source connected to the ground voltage GND, a drain connected to the level shift output, and a gate connected to the level shift input.

2. A level shift circuit for changing the signal level in a first logic circuit fed from a first power supply to the signal level in a second logic circuit fed from a second power supply, comprising:
   a level shift core circuit which is controlled by a control circuit, wherein:
   the level shift core circuit, being fed from the second power supply, receives level shift input signals output from the first logic circuit and control signals output from the control circuit and outputs level shift output signals to be input to the second logic circuit;

the control circuit comprises: a first NOR circuit fed from the second power supply, which receives an inverted signal of the level shift input signals and a non-inverted signal of the level shift output signals; a second NOR circuit fed from the second power supply, which receives a non-inverted signal of the level shift input signals and an inverted signal of the level shift output signals; and a plurality of inverters fed from the second power supply, which receives the outputs of the NOR circuits, respectively; where the control circuit outputs the output signals of the respective first and second NOR circuits and the inverters as control signals to the level shift core circuit; and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

3. A level shift circuit for changing the signal level in a first logic circuit fed from a first power supply to the signal level in a second logic circuit fed from a second power supply, comprising:

a level shift core circuit for implementing a level shift;

a pull-up and pull-down circuit fed from the second power supply for pulling up and/or pulling down level shift output signals from the level shift core circuit; and a control circuit fed from the second power supply, which receives level shift input signals output from the first logic circuit and the level shift output signals for controlling the pull-up and pull-down circuit, wherein:

the control circuit comprises: a first NOR circuit fed from the second power supply, which receives an inverted signal of the level shift input signals and a non-inverted signal of the level shift output signals; and a second NOR circuit fed from the second power supply, which receives a non-inverted signal of the level shift input signals and an inverted signal of the level shift output signals;

the control circuit outputs the output signals of the first and second NOR circuits as control signals; and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

4. A level shift circuit for changing the signal level in a first logic circuit fed from a first power supply to the signal level in a second logic circuit fed from a second power supply, comprising:

a level shift core circuit for implementing a level shift;

a pull-up and pull-down circuit fed from the second power supply for pulling up and/or pulling down level shift output signals from the level shift core circuit; and a control circuit fed from the second power supply, which receives level shift input signals output from the first logic circuit and the level shift output signals for controlling the pull-up and pull-down circuit, wherein:

the control circuit comprises: a first NOR circuit fed from the second power supply, which receives an inverted signal of the level shift input signals and a non-inverted signal of the level shift output signals; a second NOR circuit fed from the second power supply, which receives a non-inverted signal of the level shift input signals and an inverted signal of the level shift output signals; and a plurality of inverters fed from the second power supply, which receives the outputs of the NOR circuits, respectively;

the control circuit outputs the output signals of the respective first and second NOR circuits and the inverters as control signals; and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

5. A level shift circuit for changing the signal level in a first logic circuit fed from a first power supply to the signal level in a second logic circuit fed from a second power supply, comprising:

a level shift core circuit which is controlled by a control circuit, wherein:

the level shift core circuit, being fed from the second power supply, receives level shift input signals output from the first logic circuit and control signals output from the control circuit and outputs level shift output signals to be input to the second logic circuit;

the control circuit comprises: a first NAND circuit fed from the second power supply, which receives a non-inverted signal of the level shift input signals and an inverted signal of the level shift output signals; and a second NAND circuit fed from the second power supply, which receives an inverted signal of the level shift input signals and a non-inverted signal of the level shift output signals; where the control circuit outputs the output signals of the first and second NAND circuits as control signals to the level shift core circuit; and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

6. A level shift circuit for changing the signal level in a first logic circuit fed from a first power supply to the signal level in a second logic circuit fed from a second power supply, comprising:

a level shift core circuit for implementing a level shift;

a pull-up and pull-down circuit fed from the second power supply for pulling up and/or pulling down level shift output signals from the level shift core circuit; and a control circuit fed from the second power supply, which receives level shift input signals output from the first logic circuit and the level shift output signals for controlling the pull-up and pull-down circuit, wherein:

the control circuit comprises: a first NAND circuit fed from the second power supply, which receives a non-inverted signal of the level shift input signals and an inverted signal of the level shift output signals; and a second NAND circuit fed from the second power supply, which receives an inverted signal of the level shift input signals and a non-inverted signal of the level shift output signals;

the control circuit outputs the output signals of the first and second NAND circuits as control signals; and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

7. A level shift circuit for changing the signal level in a first logic circuit fed from a first power supply to the signal level in a second logic circuit fed from a second power supply, comprising:

a level shift core circuit for implementing a level shift;

a pull-up and pull-down circuit fed from the second power supply for pulling up and/or pulling down level shift output signals from the level shift core circuit; and a control circuit fed from the second power supply, which receives level shift input signals output from the first logic circuit and the level shift output signals for controlling the pull-up and pull-down circuit, wherein:

the control circuit comprises: a first NAND circuit fed from the second power supply, which receives a non-inverted signal of the level shift input signals and an inverted signal of the level shift output signals; a second NAND circuit fed from the second power supply, which receives an inverted signal of the level shift input signals and a non-inverted signal of the level shift output signals; and a plurality of inverters fed from the second power supply, which receives the outputs of the first and second NAND circuits, respectively;

the control circuit outputs the output signals of the respective first and second NAND circuits and the inverters as control signals; and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

8. A level shift circuit for changing the signal level in a first logic circuit fed from a first power supply to the signal level in a second logic circuit fed from a second power supply, comprising:

a level shift core circuit which is controlled by a control circuit, wherein:

the level shift core circuit, being fed from the second power supply, receives level shift input signals output from the first logic circuit and control signals output from the control circuit and outputs level shift output signals to be input to the second logic circuit;

the control circuit comprising: a first NAND circuit fed from the second power supply, which receives an inverted signal of the level shift input signals and a non-inverted signal of the level shift output signals; a second NAND circuit fed from the second power supply, which receives a non-inverted signal of the level shift input signals and an inverted signal of the level shift output signals; and a plurality of inverters fed from the second power supply, which receives the outputs of the NAND circuits, respectively; where the control circuit outputs the output signals of the respective first and second NAND circuits and the inverters as control signals to the level shift core circuit, and the level shift core circuit comprises: a PMOS cross-coupled latch including a first plurality of PMOSs, a differential PMOS switch including a second plurality of PMOSs, and a differential NMOS switch including a plurality of NMOSs:

wherein each PMOS of the second plurality of PMOSs has a source connected to a drain of a PMOS of the first plurality of PMOSs, a drain connected to the level shift output, and a gate connected to one of the control signals from the control circuit;

wherein each PMOS of the first plurality of PMOSs has a source connected to the second power supply, a gate connected to the level shift output through the drain of another PMOS of the second plurality of PMOSs, where the other PMOS of the second plurality PMOSs does not share a drain to source connection with the PMOS of the first plurality of PMOSs; and wherein each NMOS of the differential NMOS switch has a source connected to the ground voltage GND, a drain connected to the level shift output, and a gate connected to the level shift input.

9. The level shift circuit claimed in one of claims 1 to 4, wherein the NOR circuit has CMOS circuitry, and each PMOS connected to the level shift input signal is a transistor which satisfies at least one of the conditions that the channel width/channel length ratio is low or that the polarity of the threshold voltage is negative and the absolute value of the threshold voltage is large.

10. The level shift circuit claimed in one of claims 5, 6, 7, or 8, wherein the NAND circuit has CMOS circuitry, and each PMOS connected to the level shift input signal is a transistor which satisfies at least one of the conditions that the channel width/channel length ratio is low or that the polarity of the threshold voltage is negative and the absolute value of the threshold voltage is large.

11. The level shift circuit claimed in one of claims 3, 4, 6, or 7, wherein the pull-up and pull-down circuit comprises: a plurality of PMOSs each having a source connected to the second power supply, a gate connected to one of the control signals from the control circuit, and a drain connected to the level shift output; and a plurality of NMOSs each having a source connected to the ground voltage GND, a gate connected to one of the control signals from the control circuit, and a drain connected to the level shift output.

12. The level shift circuit claimed in one of claims 1, 2, 6, or 8, further comprising: a pull up and pull down circuit having a pull up circuit and a pull down circuit which pulls up and/or pulls down the level shift output signals, wherein the control circuit is configured to output control signals to the pull up and pull down circuit for controlling at least one of the pull up circuit and the pull down circuit.

13. The level shift circuit of claim 12, wherein the pull-up circuit comprises: a plurality of PMOSs each having a source connected to the second power supply, a gate connected to one of the control signals from the control circuit, and a drain connected to the level shift output; and the pull-down circuit comprises: a plurality of NMOSs each having a source connected to the ground voltage GND, a gate connected to a control signal from the control circuit, and a drain connected to the level shift output.

* * * * *